US 9,991,881 B2

(12) United States Patent
Na et al.

(10) Patent No.: US 9,991,881 B2
(45) Date of Patent: Jun. 5, 2018

(54) SWITCHING CIRCUIT

(71) Applicant: TOYOTA JIDOSHA KABUSHIKI KAISHA, Toyota-shi, Aichi-ken (JP)

(72) Inventors: Hyoungjun Na, Nagakute (JP); Ken Toshiyuki, Seto (JP); Shouji Abou, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days. days.

(21) Appl. No.: 15/337,618

(22) Filed: Oct. 28, 2016

(65) Prior Publication Data

US 2017/0149425 A1    May 25, 2017

(30) Foreign Application Priority Data

Nov. 20, 2015  (JP) ................. 2015-227849

(51) Int. Cl.
*H03K 17/60* (2006.01)
*H03K 17/06* (2006.01)
*H01L 27/06* (2006.01)
*H03K 17/567* (2006.01)
*H03K 17/16* (2006.01)
*H01L 23/528* (2006.01)
(Continued)

(52) U.S. Cl.
CPC ......... *H03K 17/06* (2013.01); *H01L 27/0635* (2013.01); *H03K 17/168* (2013.01);
(Continued)

(58) Field of Classification Search
CPC .... H03K 17/06; H03K 17/063; H03K 17/164; H03K 17/16; H03K 17/161; H03K 17/165; H03K 17/166; H03K 17/167; H03K 17/168; H03K 17/56; H03K 17/567; H03K 5/01; H01L 27/0635; H01L 29/7393;
(Continued)

(56) References Cited

U.S. PATENT DOCUMENTS 7,889,477 B2 * 2/2011 Neubarth ............ H02M 3/3384
361/212
8,766,702 B2 * 7/2014 Hussein ............... H03K 17/127
327/108
(Continued)

FOREIGN PATENT DOCUMENTS

JP    2004-112916 A    4/2004
JP    2005-6412 A    1/2005
(Continued)

*Primary Examiner* — Lincoln Donovan
*Assistant Examiner* — Diana J Cheng
(74) *Attorney, Agent, or Firm* — Oliff PLC

(57) ABSTRACT

A switching circuit includes a wiring into which a parallel circuit of a first IGBT and a second IGBT is inserted, and a gate control circuit. The gate control circuit has a first switching element configured to control a gate potential of the first IGBT according to a potential of a second principal electrode, and a second switching element configured to control a gate potential of the second IGBT according to a potential of a fourth principal electrode. An output terminal of the control device is connected to the first switching element through a first switch and is connected to the second switching element through a second switch. The control device applies a control signal to the output terminal in a state where the first switch and the second switch are turned on when switching both of the first IGBT and the second IGBT.

4 Claims, 12 Drawing Sheets

(51) Int. Cl.
  *H01L 49/02* (2006.01)
  *H01L 29/73* (2006.01)
  *H01L 29/739* (2006.01)
  *H01L 29/861* (2006.01)
  *H01L 27/082* (2006.01)

(52) U.S. Cl.
  CPC .......... *H03K 17/567* (2013.01); *H01L 23/528* (2013.01); *H01L 27/0825* (2013.01); *H01L 28/20* (2013.01); *H01L 29/73* (2013.01); *H01L 29/7393* (2013.01); *H01L 29/861* (2013.01)

(58) Field of Classification Search
  CPC ..... H01L 29/861; H01L 29/20; H01L 29/528; H01L 29/68; H01L 29/70; H01L 29/72; H01L 29/73; H02M 1/08; H02M 1/088
  USPC .................................................. 327/432, 383
  See application file for complete search history.

(56) References Cited

U.S. PATENT DOCUMENTS

| | | |
|---|---|---|
| 2004/0252430 A1 | 12/2004 | Oumaru et al. |
| 2012/0280728 A1 | 11/2012 | Hussein et al. |
| 2016/0233858 A1 | 8/2016 | Wasekura et al. |

FOREIGN PATENT DOCUMENTS

| | | |
|---|---|---|
| JP | 2012-249509 A | 12/2012 |
| JP | 2016-146717 A | 8/2016 |

\* cited by examiner

SWITCHING CIRCUIT

INCORPORATION BY REFERENCE

The disclosure of Japanese Patent Application No. 2015-227849 filed on Nov. 20, 2015 including the specification, drawings and abstract is incorporated herein by reference in its entirety.

BACKGROUND OF THE INVENTION

1. Field of the Invention

The present invention relates to a switching circuit.

2. Description of Related Art

Japanese Patent Application Publication No. 2004-112916 (JP 2004-112916 A) discloses a switching circuit using a plurality of IGBTs (Insulated Gate Bipolar Transistors). According to the IGBT, a large current can be switched.

SUMMARY OF THE INVENTION

In a switching circuit using an IGBT, turn-off loss occurring in the IGBT causes a problem. It is known that the switching rate of the IGBT increases with a decrease in gate resistance. Accordingly, if the switching rate increases, that is, if the gate resistance decreases, turn-off loss decreases. However, the inventors have confirmed that, in a case where a current flowing in the IGBT is small, the relationship between the switching rate and the turn-off loss is not established. That is, it has been confirmed that it is difficult to reduce the turn-off loss of the IGBT at the time of a low current by decreasing the gate resistance. Accordingly, in this specification, a new technique for reducing the turn-off loss of the IGBT at the time of a low current is provided.

The inventors have confirmed that, in a case where a current flowing in the IGBT is small, while there is a relationship that the smaller the size of the IGBT, the smaller the turn-off loss, if the current flowing in the IGBT increases, the relationship between the size of the IGBT and the turn-off loss is eliminated. In the technique disclosed in this specification, the turn-off loss of the IGBT is reduced using this phenomenon.

A switching circuit according to an aspect of the invention includes a first IGBT; a second IGBT; a wiring configured to connect the first IGBT and the second IGBT in parallel; and a gate control circuit configured to switch the first IGBT and the second IGBT by controlling a gate potential of the first IGBT and a gate potential of the second IGBT, wherein the gate control circuit includes a first switching element including a first principal electrode, a second principal electrode, and a first control electrode, the first switching element being configured to switch the on and off states of the first principal electrode and the second principal electrode according to a potential of the first control electrode, a potential of the first principal electrode being higher than a gate threshold of the first IGBT, and the first switching element being configured to control a gate potential of the first IGBT according to a potential of the second principal electrode, a second switching element including a third principal electrode, a fourth principal electrode, and a second control electrode, the second switching element being configured to switch the on and off states of the third principal electrode and the fourth principal electrode according to a potential of the second control electrode, a potential of the third principal electrode being higher than a gate threshold of the second IGBT, and the second switching element being configured to control a gate potential of the second IGBT according to a potential of the fourth principal electrode, a first switch connected to the first control electrode, a second switch connected to the second control electrode, and a control device having an output terminal connected to the first control electrode through the first switch and connected to the second control electrode through the second switch, the control device being configured to apply a control signal for switching the first switching element and the second switching element to the output terminal, the gate control circuit is configured to execute a first control procedure when a current flowing in the wiring is greater than a threshold, the first control procedure being executed so as to turn on both of the first IGBT and the second IGBT at the turn-on timing, and to turn off both of the first IGBT and the second IGBT at the turn-off timing, the gate control circuit is configured to execute a second control procedure when the current flowing in the wiring is smaller than the threshold, the second control procedure being executed so as to turn on a first target IGBT at the turn-on timing, to turn off first target IGBT at the turn-off timing, and to turn off a second target IGBT prior to the turn-off timing, the first target IGBT being one of the first IGBT and the second IGBT, the second target IGBT being the other of the first IGBT and the second IGBT, the gate control circuit is configured to apply the control signal to the output terminal during the first switch and the second switch are turned on when switching both of the first IGBT and the second IGBT, and the gate control circuit is configured to apply the control signal to the output terminal during a switch for controlling the first target IGBT between the first switch and the second switch is turned on and a switch for controlling the second target IGBT between the first switch and the second switch is turned off when switching the first target IGBT without switching the second target IGBT.

The second principal electrode of the first switching element may have electric conduction with the gate of the first IGBT, or may be connected to the gate of the first IGBT through another element. That is, if the gate potential of the first IGBT can be controlled according to the potential of the second principal electrode, the second principal electrode may be connected to the gate of the first IGBT in any aspects. The fourth principal electrode of the second switching element may have electric conduction with the gate of the second IGBT, or may be connected to the gate of the second IGBT through another element. That is, if the gate potential of the second IGBT can be controlled according to the potential of the fourth principal electrode, the fourth principal electrode may be connected to the gate of the second IGBT in any aspects.

"The switch for controlling the first target IGBT" is one of the first switch and the second switch, and is a switch which is connected to the gate of a switching element (one of the first switching element and the second switching element) for controlling the gate potential of the first target IGBT. "The switch for controlling the second target IGBT" is one of the first switch and the second switch, and is a switch which is connected to the gate of a switching element (one of the first switching element and the second switching element) for controlling the gate potential of the second target IGBT.

Since the second target IGBT is turned off prior to the turn-off timing, during the second control procedure, an aspect in which the second target IGBT is not turned on may be made, or an aspect in which the second target IGBT and the first target IGBT are turned on together, and then, the second target IGBT is turned off ahead of the first target IGBT may be made. An aspect in which one of the first IGBT and the second IGBT is fixed as the second target IGBT, and the other of the first IGBT and the second IGBT is fixed as the first target IGBT may be made, or an aspect in which a period during which the first IGBT is the second target IGBT and a period during which the second IGBT is the second target IGBT alternately appear may be made.

The control device can perform determination of whether to execute the first control procedure or to execute the second control procedure based on the current of the wiring at the time of the determination or at the time before the time of the determination. The determination may be executed according to whether or not the current flowing in the wiring is greater than the threshold, or may be executed according to whether or not a predetermined value which is calculated based on the current flowing in the wiring is greater than the threshold. For example, a predicted value of the current flowing in the wiring at the time before the time of the determination may be calculated and the determination may be executed according to whether or not the predicted value is greater than the threshold.

In this switching circuit, the current flowing in the wiring is switched by the parallel circuit in which the first IGBT and the second IGBT are connected in parallel. The switching circuit executes the first control procedure and the second control procedure based on the current flowing in the wiring.

When the current flowing in the wiring is large, the first control procedure is executed. In the first control procedure, the first IGBT and the second IGBT are turned on from the turn-on timing to the turn-off timing. For this reason, a current flows in both of the first IGBT and the second IGBT. In a case where the current flowing in the wiring is large, the first control procedure is executed, whereby a current can flow in the first IGBT and the second IGBT in a distributed manner. With this, it is possible to reduce the loads of the first IGBT and the second IGBT. At the turn-off timing, the first IGBT and the second IGBT are turned off. In this case, since the size of the IGBT to be turned off becomes the total size of the first IGBT and the second IGBT, the size of the IGBT to be turned off is large. However, in the first control procedure, since the current flowing in the wiring (that is, the first IGBT and the second IGBT) is large, there is little correspondence relationship between the size of the IGBT to be turned off and the turn-off loss. Accordingly, in this way, even if the first IGBT and the second IGBT are turned off, no so large turn-off loss occurs.

When the current flowing in the wiring is small, the second control procedure is executed. In the second control procedure, the second target IGBT is turned off prior to the turn-off timing. Accordingly, at the turn-off timing, the first target IGBT is turned off in a state where the second target IGBT is already turned off. In this case, since the size of the IGBT to be turned off is the size of the first target IGBT, the size of the IGBT to be turned off is smaller than that in the first control procedure. In the second control procedure, since the current flowing in the wiring is small, the first target IGBT is turned off (that is, the size of the IGBT to be turned off decreases) in a state where the second target IGBT is turned off, whereby it is possible to reduce turn-off loss. In the second control procedure, the second target IGBT is turned off at least immediately before the turn-off timing, and the first target IGBT is turned on. For this reason, a current does not flow in the second target IGBT and flows in the first target IGBT. However, since the current flowing in the wiring is small, in this way, even if a current flows unevenly in the first target IGBT, an excessive load is not applied to the first target IGBT.

In this way, according to this switching circuit, it is possible to reduce turn-off loss at the time of a small current while reducing a load of each IGBT at the time of a large current.

The first switching element controls the gate potential of the first IGBT, and the second switching element controls the gate potential of the second IGBT. In the second control procedure, it is necessary to control the first switching element and the second switching element individually. In order to control the first switching element and the second switching element individually, a case where a control device for a first switching element and a control device for a second switching element are provided individually is considered. However, in this way, if the control devices are provided individually, when the first switching element and the second switching element are turned on together at the turn-on timing of the first control procedure, a difference may occur between control signals (that is, a control signal for a first switching element and a control signal for a second switching element) which are applied to the respective control devices. As a result, deviation occurs between the turn-on timings of the first switching element and the second switching element, and deviation also occurs between the turn-on timings of the first IGBT and the second IGBT. Then, a high current flows unevenly in the IGBT turned on ahead, and a high load is applied to the IGBT.

In contrast, in the switching circuit disclosed in this specification, one output terminal of the control device is connected to a first control terminal of the first switching element and a second control terminal of the second switching element. The first switch is provided between the output terminal and the first control terminal, and the second switch is provided between the output terminal and the second control terminal.

The control device applies the control signal to the output terminal in a state where the first switch and the second switch are turned on when switching both of the first IGBT and the second IGBT. For this reason, the same control signal is input to the first control terminal of the first switching element and the second control terminal of the second switching element. For this reason, it is possible to turn on the first switching element and the second switching element substantially simultaneously, and to turn on the first IGBT and the second IGBT substantially simultaneously. That is, it is possible to prevent deviation between the turn-on timings of the first IGBT and the second IGBT. Therefore, it is possible to prevent a current from flowing unevenly in one IGBT.

In the second control procedure, there is a case where the first target IGBT is switched and the second target IGBT is not switched. The control device applies the control signal to the output terminal in a state where the switch for controlling the first target IGBT is turned on and the switch for controlling the second target IGBT is turned off when the first target IGBT is switched and the second target IGBT is not switched. According to this configuration, it is possible to switch the first target IGBT alone without switching the second target IGBT.

In the above-described aspect, the switching circuit may further include a first resistor, and a second resistor, the first resistor and the second resistor being connected in series between the gate of the first IGBT and the gate of the second IGBT, and the control device controls a potential of the control signal based on a potential of the wiring between the first resistor and the second resistor when both of the first IGBT and the second IGBT are turned on.

In the above-described aspect, the first switching element and the second switching element may be npn bipolar transistors.

In the above-described aspect, the switching circuit may further include a first diode having an anode connected to the gate of the first IGBT, a second diode having an anode connected to the gate of the second IGBT, and a third switching element including a fifth principal electrode, a sixth principal electrode, and a third control electrode, the third switching element being configured to switch the on and off states of the fifth principal electrode and the sixth principal electrode according to a potential of the third control electrode, the fifth principal electrode being connected to a cathode of the first diode and a cathode of the second diode, and a potential of the sixth principal electrode being lower than a gate threshold of the first IGBT and a gate threshold of the second IGBT.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
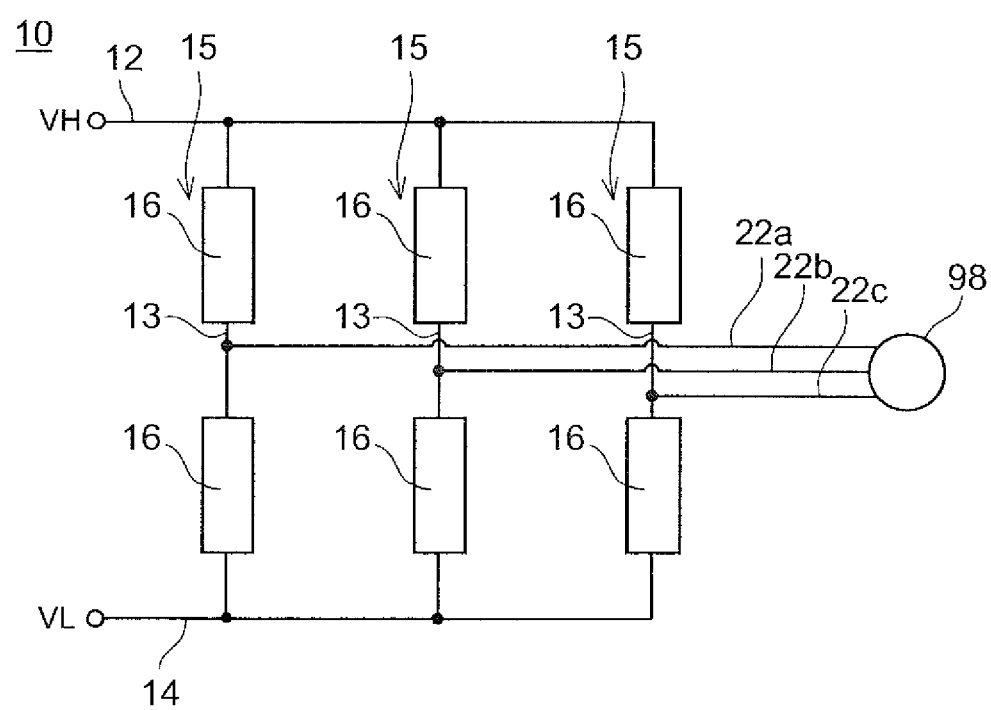
FIG. 1 is a circuit diagram of an inverter circuit 10.

An inverter circuit 10 shown in FIG. 1 supplies an AC current to a motor 98 for traveling of a vehicle. The inverter circuit 10 has a high-potential wiring 12 and a low-potential wiring 14. The high-potential wiring 12 and the low-potential wiring 14 are connected to a DC power supply (not shown). A high potential VH is applied to the high-potential wiring 12, and a low potential VL is applied to the low-potential wiring 14. Three series circuits 15 are connected in parallel between the high-potential wiring 12 and the low-potential wiring 14. Each series circuit 15 has a connection wiring 13 which is connected between the high-potential wiring 12 and the low-potential wiring 14, and two switching circuits 16 which are provided in the connection wiring 13. The two switching circuits 16 are connected in series between the high-potential wiring 12 and the low-potential wiring 14. Output wirings 22a to 22c are connected to the connection wiring 13 between the two switching circuits 16 connected in series. The other terminal of the output wirings 22a to 22c is connected to the motor 98. The inverter circuit 10 supplies a three-phase AC current to the motor 98 by switching the respective switching circuits 16.

Figure 2:
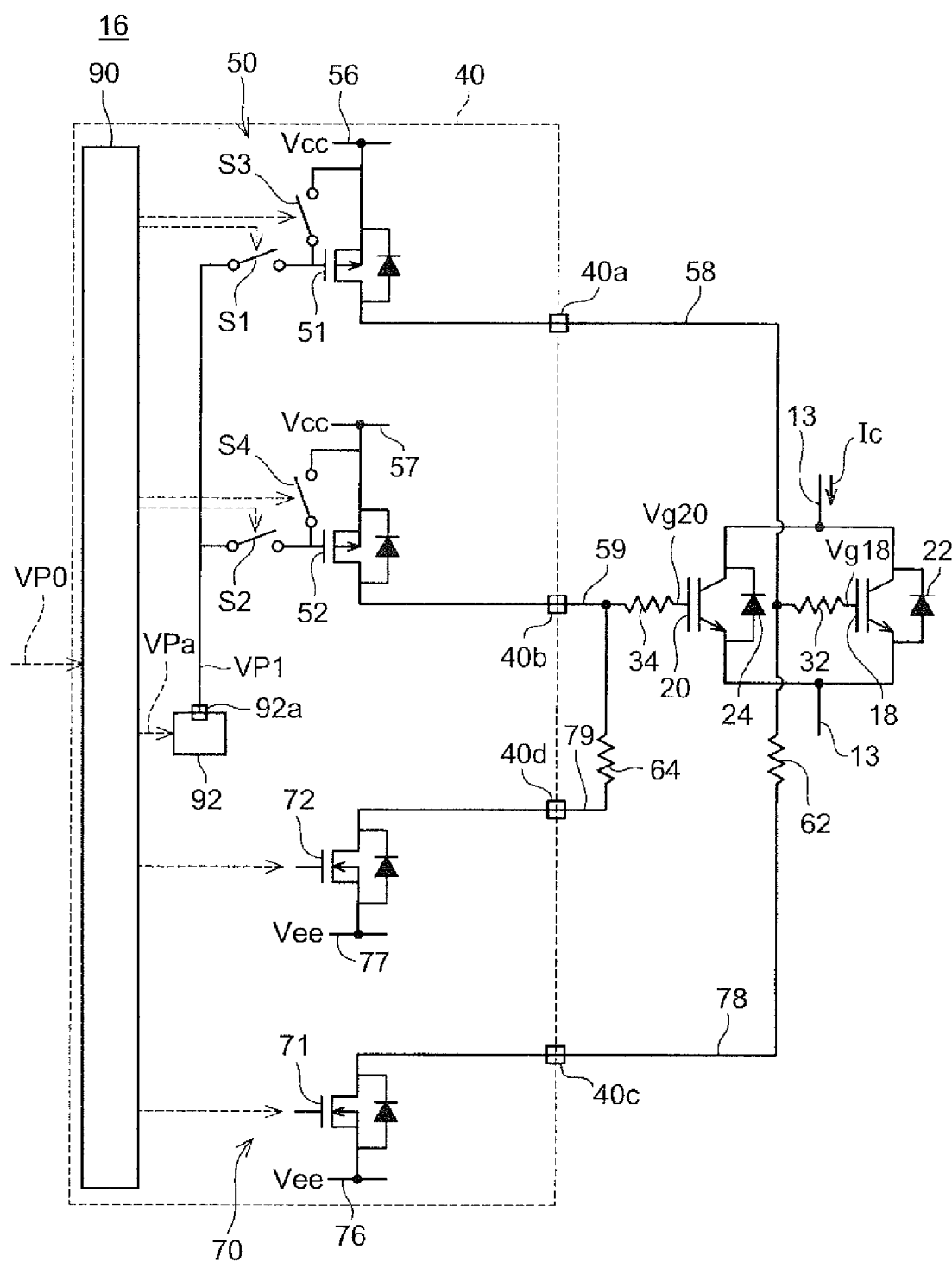
FIG. 2 is a circuit diagram of a switching circuit 16 of Example 1.

FIG. 2 shows an internal circuit of the switching circuit 16 of Example 1. FIG. 2 shows the configuration of one switching circuit 16, and the respective switching circuits 16 have the same configuration. As shown in FIG. 2, the switching circuit 16 has an IGBT 18 and an IGBT 20. The IGBT 18 and the IGBT 20 are connected in parallel to each other. That is, the collector of the IGBT 18 is connected to the collector of the IGBT 20, and the emitter of the IGBT 18 is connected to the emitter of the IGBT 20. The parallel circuit of the IGBT 18 and the IGBT 20 is provided in the connection wiring 13. A diode 22 is connected in reversely parallel to the IGBT 18. That is, the anode of the diode 22 is connected to the emitter of the IGBT 18. The cathode of the diode 22 is connected to the collector of the IGBT 18. A diode 24 is connected in reversely parallel to the IGBT 20. The anode of the diode 24 is connected to the emitter of the IGBT 20. The cathode of the diode 24 is connected to the collector of the IGBT 20.

Figure 3:
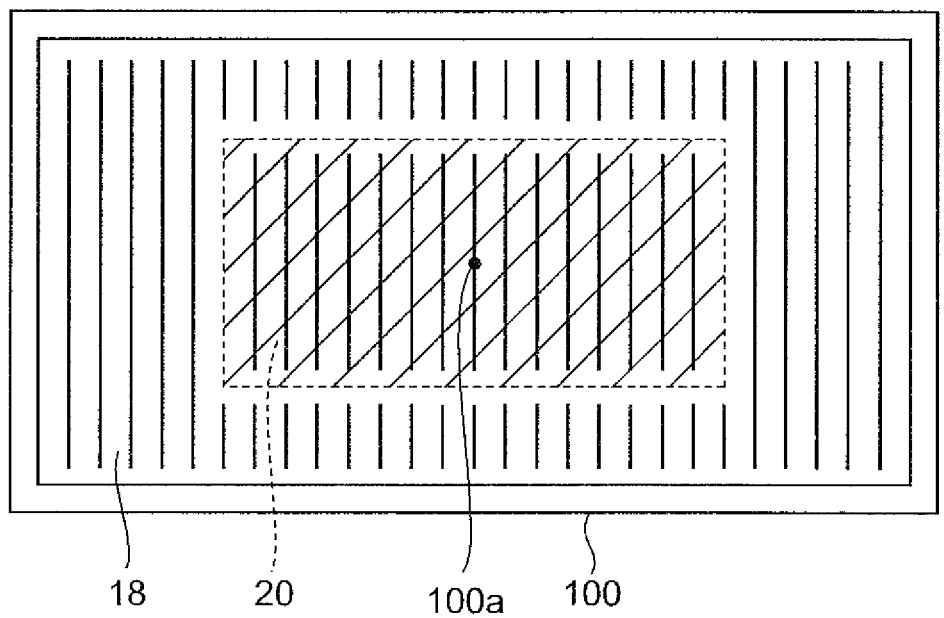
FIG. 3 is a plan view of a semiconductor substrate 100 including IGBTs 18, 20.

The IGBT 18 and the IGBT 20 may be formed on different semiconductor substrates, or may be formed on the same semiconductor substrate. In a case where the IGBT 18 and the IGBT 20 are formed on the same semiconductor substrate, a configuration shown in FIG. 3 can be used. As shown in FIG. 3, the IGBT 18 and the IGBT 20 are formed on one semiconductor substrate 100. When the top surface of the semiconductor substrate 100 is viewed in plan view, the IGBT 20 is formed in a range including a center 100a of the semiconductor substrate 100, and the IGBT 18 is formed in the periphery of the IGBT 20. The emitter of the IGBT 18 and the emitter of the IGBT 20 are connected to a common emitter electrode. The collector of the IGBT 18 and the collector of the IGBT 20 are connected to a common collector electrode. The gate electrode of the IGBT 18 and the gate electrode of the IGBT 20 are separated from each other. Accordingly, the gate potential of the IGBT 18 can be controlled to a potential different from the gate potential of the IGBT 20. That is, the gate potential of the IGBT 18 and the gate potential of the IGBT 20 can be controlled individually. FIG. 3 is an example, and in a case where the IGBT 18 and the IGBT 20 are formed on the same semiconductor substrate, a configuration different from FIG. 3 may be used.

The switching circuit 16 has gate resistors 32, 34, 62, 64 and a gate control IC 40. The gate resistor 32 has one end connected to the gate of the IGBT 18 and the other end connected to a terminal 40a of the gate control IC 40. The gate resistor 34 has one end connected to the gate of the IGBT 20 and the other end connected to a terminal 40b of the gate control IC 40. The gate resistor 62 has one end connected to the gate of the IGBT 18 through the gate resistor 32 and the other end connected to a terminal 40c of the gate control. IC 40. The gate resistor 64 has one end connected to the gate of the IGBT 20 through the gate resistor 34 and the other end connected to a terminal 40d of the gate control IC 40.

The gate control IC 40 controls a gate potential Vg18 of the IGBT 18 and a gate potential Vg20 of the IGBT 20. The gate control IC 40 has a logic circuit 90, a control amplifier 92, a gate turn-on circuit 50, and a gate turn-off circuit 70.

Figure 4:
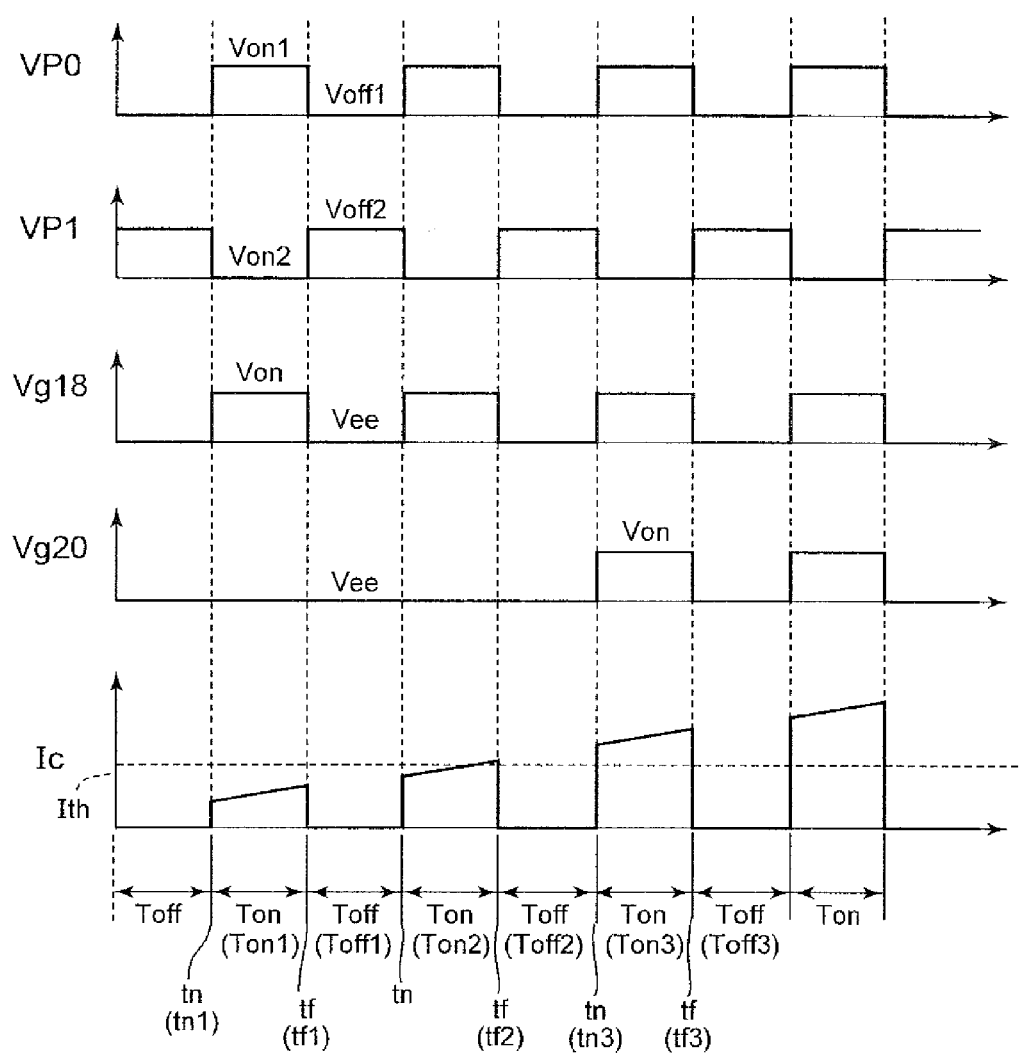
FIG. 4 is a graph showing change with time of each value in a one-side control procedure and a both-side control procedure of Example 1.

A PWM signal VP0 is input to the logic circuit 90 from the outside. As shown in FIG. 4, the PWM signal VP0 is a pulse signal which transits between a high potential Von1 and a low potential Voff1. A duty ratio of the PWM signal VP0 changes according to the operation state of the motor 98. A signal VPa having the same waveform as the PWM signal VP0 is sent from the logic circuit 90 to the control amplifier 92.

A value of a current Ic flowing in the connection wiring 13 is input to the logic circuit 90. A collector current of the IGBT 18 can be measured from a potential of a detection electrode (not shown) (an electrode for detecting the collector current) of the IGBT 18. A collector current of the IGBT 20 can be measured from a potential of a detection electrode (not shown) of the IGBT 20. The current Ic flowing in the connection wiring 13 is measured by adding the collector current of the IGBT 18 and the collector current of the IGBT 20. The current Ic may be measured by a different method. The logic circuit 90 sends a signal to the gate turn-on circuit 50 and the gate turn-off circuit 70 according to the current Ic flowing in the connection wiring 13.

The signal VPa having the same waveform as the PWM signal VP0 is input to the control amplifier 92 from the logic circuit 90. Though not shown, the switching circuit 16 includes a circuit which measures the gate potential and a gate current of the IGBT 18, and a circuit which measures the gate potential and a gate current of the IGBT 20. The values of the gate potential and the gate current of the IGBT 18 and the values of the gate potential and the gate current of the IGBT 20 are input to the control amplifier 92. The control amplifier 92 has an output terminal 92a. The control amplifier 92 outputs a drive signal VP1 to the output terminal 92a based on the PWM signal VPa and the gate potentials and the gate currents of the IGBTs 18, 20. As shown in FIG. 4, the drive signal VP1 is a pulse signal which transits between a low potential Von2 and a high potential Voff2. The drive signal VP1 is a pulse signal obtained by inverting the PWM signal VP0 (that is, the signal VPa). The control amplifier 92 controls the magnitude of the low potential Von2 of the drive signal VP1 based on the gate potentials and the gate currents of the IGBTs 18, 20.

The gate turn-on circuit 50 has PMOSs 51, 52 and switches S1 to S4.

The source of the PMOS 51 is connected to a wiring 56 to which a reference potential Vcc is applied. The reference potential Vcc is a potential which is higher than a gate threshold of each of the IGBTs 18, 20. The drain of the PMOS 51 is connected to the terminal 40a. That is, the drain of the PMOS 51 is connected to the gate of the IGBT 18 through the gate resistor 32. Hereinafter, a wiring which connects the drain of the PMOS 51 and the gate of the IGBT 18 is referred to as a gate turn-on wiring 58. The gate of the PMOS 51 is connected to the output terminal 92a of the control amplifier 92 through the switch S1. In a state where the switch S1 is turned on, the drive signal VP1 which is applied to the output terminal 92a by the control amplifier 92 is input to the gate of the PMOS 51. The switch S3 is connected between the gate and the source of the PMOS 51. If the switch S3 is turned on, the PMOS 51 is maintained in an off state.

The source of the PMOS 52 is connected to a wiring 57 to which the reference potential Vcc is applied. The drain of the PMOS 52 is connected to the terminal 40b. That is, the drain of the PMOS 52 is connected to the gate of the IGBT 20 through the gate resistor 34. Hereinafter, a wiring which connects the drain of the PMOS 52 and the gate of the IGBT 20 is referred to as a gate turn-on wiring 59. The gate of the PMOS 52 is connected to the output terminal 92a of the control amplifier 92 through the switch S2. In a state where the switch S2 is turned on, the drive signal VP1 which is applied to the output terminal 92a by the control amplifier 92 is input to the gate of the PMOS 52. The switch S4 is connected between the gate and the source of the PMOS 52. If the switch S4 is turned on, the PMOS 52 is maintained in an off state.

The switches S1 to S4 are controlled by the logic circuit 90.

The gate turn-off circuit 70 has NMOSs 71, 72.

The source of the NMOS 71 is connected to a wiring 76 to which a reference potential Vee is applied. The reference potential Vee is a potential which is substantially equal to an emitter potential of each of the IGBTs 18, 20. The drain of the NMOS 71 is connected to the terminal 40c. That is, the drain of the NMOS 71 is connected to the gate of the IGBT 18 through the gate resistors 62, 32. Hereinafter, a wiring which connects the drain of the NMOS 71 and the gate of the IGBT 18 is referred to as a gate turn-off wiring 78. The gate of the NMOS 71 is connected to the logic circuit 90.

The source of the NMOS 72 is connected to a wiring 77 to which the reference potential Vee is applied. The drain of the NMOS 72 is connected to the terminal 40d. That is, the drain of the NMOS 72 is connected to the gate of the IGBT 20 through the gate resistors 64, 34. Hereinafter, a wiring which connects the drain of the NMOS 72 and the gate of the IGBT 20 is referred to as a gate turn-off wiring 79. The gate of the NMOS 72 is connected to the logic circuit 90.

Next, the operation of the switching circuit 16 will be described. As shown in FIG. 4, the PWM signal VP0 which is input to the logic circuit 90 transits between the high potential Von1 and the low potential Voff1. The high potential Von1 is a signal which means that the switching circuit 16 is brought into an on state, and the low potential Voff1 is a signal which means that the switching circuit 16 is brought into an off state. Accordingly, the timing at which the PWM signal VP0 transits from the low potential Voff1 to the high potential Von1 is a turn-on timing to at which the switching circuit 16 is turned on. The timing at which the PWM signal VP0 transits from the high potential Von1 to the low potential Voff1 is a turn-off timing tf at which the switching circuit 16 is turned off. Hereinafter, a period during which the PWM signal VP0 is at the high potential Von1 is referred to as a turn-on period Ton, and a period during which the PWM signal VP0 is at the low potential Voff1 is referred to as a turn-off period Toff.

The logic circuit 90 executes a one-side control procedure for switching only the IGBT 18 and a both-side control procedure for switching both of the IGBT 18 and the IGBT 20 according to the current Ic. In a period before a turn-off timing tf2 of FIG. 4, since the current Ic is low, the logic circuit 90 executes the one-side control procedure. In a period after the turn-off timing tf2, since the current Ic is high, the logic circuit 90 executes the both-side control procedure. Hereinafter, the details of the one-side control procedure and the both-side control procedure will be described.

In the one-side control procedure, the logic circuit 90 controls the respective units as follows. Switch S1: on, Switch S2: off, Switch S3: off, Switch S4: on, NMOS 72: on Since the switch S2 is maintained to be off and the switch S4 is maintained to be on, the PMOS 52 is maintained to be off during the one-side control procedure. Since the NMOS 72 is maintained to be off, the potential Vee (a potential lower than the gate threshold of the IGBT 20) is applied to the gate of the IGBT 20 during the one-side control procedure. Accordingly, the IGBT 20 is maintained to be off. Since the switch S1 is maintained to be on, the drive signal VP1 of the control amplifier 92 is input to the gate of the PMOS 51 during the one-side control procedure. Since the switch S3 is maintained to be off, the PMOS 51 is switched according to the drive signal VP1 during the one-side control procedure. During the one-side control procedure, the logic circuit 90 applies a signal VP2 obtained by inverting the PWM signal VP0 to the gate of the NMOS 71.

If the respective units are controlled as described above, at a first turn-on timing ni1 of FIG. 4, the PMOS 51 is turned on and the NMOS 71 is turned off. Then, the gate current flows from the wiring 56 toward the gate of the IGBT 18 through the PMOS 51 and the gate turn-on wiring 58. For this reason, the gate of the IGBT 18 is charged and the gate potential Vg18 increases from the potential Vee to a potential Von. The potential Von is a potential which is lower than the potential Vcc and is higher than the gate threshold of each of the IGBTs 18, 20. The gate potential (that is, the potential Von2 of the drive signal VP1) of the PMOS 51 is controlled by feedback control based on the gate potential Vg18 of the IGBT 18, whereby the gate potential Vg18 of the IGBT 18 is accurately controlled to the potential Von. Since the potential Von is higher than the gate threshold of the IGBT 18, the IGBT 18 is turned on. Accordingly, in a turn-on period Ton1, the current Ic flows. In the turn-on period Ton1, the current Ic gradually increases.

Thereafter, if a turn-off timing tf1 comes, the PMOS 51 is turned off and the NMOS 71 is turned on. Then, the gate current flows from the gate of the IGBT 18 toward the wiring 76 through the gate turn-off wiring 78 and the NMOS 71. For this reason, the gate of the IGBT 18 is discharged, and the gate potential Vg18 decreases from the potential Von to the potential Vee. Since the potential Vee is lower than the gate threshold of the IGBT 18, the IGBT 18 is turned off. Accordingly, the current Ic does not flow in a turn-off period Toff1.

In the one-side control procedure, the turn-on period Ton and the turn-off period Toff are repeated, whereby the IGBT 18 is repeatedly turned on and off. That is, in the one-side control procedure, in a state where the IGBT 20 is maintained in the off state, the IGBT 18 is repeatedly turned on and off.

The logic circuit 90 constantly monitors the current Ic. If the current Ic exceeds a threshold Ith in a period Tong during which the one-side control procedure is executed, in a turn-off period Toff immediately thereafter, the logic circuit 90 switches the procedure from the one-side control procedure to the both-side control procedure. The threshold Ith may have a hysteresis characteristic.

In the both-side control procedure, the logic circuit 90 controls the respective units as follows. Switch S1: on, Switch S2: on, Switch S3: off, Switch S4: off Since the switches S1, S2 are turned on, during the both-side control procedure, the drive signal VP1 of the control amplifier 92 is input to the gate of the PMOS 51 and the gate of the PMOS 52. Since the switches S3, S4 are turned off, during the both-side control procedure, the PMOSs 51, 52 are switched according to the drive signal VP1. The logic circuit 90 applies the signal VP2 obtained by inverting the PWM signal VP0 to the gate of the NMOS 71 and the gate of the NMOS 72.

Even if the respective units are controlled as described above, during a turn-off period Toff2, the current Ic does not flow. That is, during the turn-off period Toff2, since the PMOSs 51, 52 are turned off and the NMOSs 71, 72 are turned on, the gate potential. Vg18 of the IGBT 18 and the gate potential Vg20 of the IGBT 20 are maintained to the potential Vee together. Accordingly, during the turn-off period Toff2, the IGBTs 18, 20 are maintained in the off state together, and the current Ic does not flow.

At a turn-on timing tn3 immediately after the turn-off period Toff2, if the drive signal VP1 is decreased from Voff2 to Von2, the PMOSs 51, 52 are turned on together. At the turn-on timing tn3, since the gate potentials of the NMOSs 71, 72 are decreased, the NMOSs 71, 72 are turned off. If the PMOS 51 is turned on and the NMOS 71 is turned off, the gate current flows from the wiring 56 toward the gate of the IGBT 18 through the PMOS 51 and the gate turn-on wiring 58. For this reason, the gate of the IGBT 18 is charged, and the gate potential Vg18 increases from the potential Vee to the potential Von. That is, the IGBT 18 is turned on. If the PMOS 52 is turned on and the NMOS 72 is turned off, the gate current flows from the wiring 57 toward the gate of the IGBT 20 through the PMOS 52 and the gate turn-on wiring 59. For this reason, the gate of the IGBT 20 is charged, and the gate potential Vg20 increases from the potential Vee to the potential Von. That is, the IGBT 20 is turned on. In this way, in a turn-on period Ton3 of the both-side control procedure, the IGBTs 18, 20 are turned on together. Accordingly, in the turn-on period Ton3, the current Ic flows.

Thereafter, if a turn-off timing tf3 comes, the PMOSs 51, 52 are turned off and the NMOSs 71, 72 are turned on. If the PMOS 51 is turned off and the NMOS 71 is turned on, the gate current flows from the gate of the IGBT 18 toward the wiring 76 through the gate turn-off wiring 78 and the NMOS 71. For this reason, the gate of the IGBT 18 is discharged, and the gate potential Vg18 decreases from the potential Von to the potential Vee. That is, the IGBT 18 is turned off. If the PMOS 52 is turned off and the NMOS 72 is turned on, the gate current flows from the gate of the IGBT 20 toward the wiring 77 through the gate turn-off wiring 79 and the NMOS 72. For this reason, the gate of the IGBT 20 is discharged, and the gate potential Vg20 decreases from the potential Von to the potential Vee. That is, the IGBT 20 is turned off. In this way, in a turn-off period Toff3, the IGBTs 18, 20 are brought into the off state together. Accordingly, the current Ic does not flow in the turn-off period Toff3.

In the both-side control procedure, the turn-on period Ton and the turn-off period Toff are repeated, whereby the IGBT 18 and the IGBT 20 are repeatedly turned on and off substantially simultaneously.

An effect of suppressing the turn-off loss of the switching circuit 16 will be described below. When the IGBTs 18, 20 are turned off, turn-off loss occurs. In a case where the current Ic is small, the correspondence relationship between the turn-off loss and the size of the IGBT to be turned off appears. That is, the smaller the size of the IGBT to be turned off, the smaller the turn-off loss. In a case where the current Ic is large, this correspondence relationship does not almost appear. The reason that the correspondence relationship changes according to the current Ic in this way is considered to be as follows. The turn-off loss occurs when carries (electrons and holes) existing in the semiconductor substrate of the IGBT immediately before turn-off are discharged from the semiconductor substrate at the time of turn-off. The larger the current Ic, the larger the number of electrons existing in the semiconductor substrate while the current Ic is flowing. If the current Ic flows regardless of the magnitude of the current Ic, the holes exist in the semiconductor substrate in a saturated state. That is, the number of holes existing in the semiconductor substrate when the current Ic is flowing is substantially constant regardless of the current Ic. Accordingly, in a case where the current Ic is small, the turn-off loss occurs primarily due to the influence of the holes. As described above, since the holes exist in the saturated state in a region of the semiconductor substrate where the current Ic is flowing, the number of holes at this time is substantially proportional to the size of the IGBT (that is, the area of the region of the semiconductor substrate where the current Ic is flowing). Accordingly, in a case where the current Ic is small, the correspondence relationship between the turn-off loss and the size of the IGBT to be turned off appears. In a case where the current Ic is large, since the number of electrons existing in the semiconductor substrate increases, the turn-off loss occurs primarily due to the influence of the electrons. For this reason, in a case where the current Ic is large, there is mostly no correspondence relationship between the tarn-off loss and the size of the IGBT to be turned off.

As described above, in a case where the current Ic is small, the switching circuit 16 turns on only the IGBT 18 in the turn-on period Ton without turning on the IGBT 20. That is, the IGBT 20 is turned off prior to the turn-off timing tf, and the IGBT 18 is turned off at the turn-off timing tf. Accordingly, at the turn-off timing tf (for example, the turn-off timing to of FIG. 4), the IGBT 18 is turned off alone. In a case where the IGBT 18 is turned off alone, since the size of a region to be turned off in the semiconductor substrate 100 (that is, the area of the region of the IGBT 18 of FIG. 3) is small, the turn-off loss decreases. In a case where the current Ic is small, even if the current Ic flows only in the IGBT 18 in the turn-on period Ton, no high load is applied to the IGBT 18. In this way, in a case where the current Ic is small, the IGBT 18 is turned off alone at the turn-off timing tf, whereby it is possible to reduce the turn-off loss while preventing an excessive load from being applied to the IGBT 18.

As described above, in a case where the current Ic is large, the switching circuit 16 turns on both of the IGBT 18 and the IGBT 20 in the turn-on period Ton. That is, both of the IGBT 18 and the IGBT 20 are turned on at the turn-on timing tn, and both of the IGBT 18 and the IGBT 20 are turned off at the turn-off timing. Accordingly, the current Ic flowing in the connection wiring 13 flows in the IGBT 18 and the IGBT 20 in a distributed manner. In this way, in a case where the current Ic is large, the current Ic flows in the IGBT 18 and the IGBT 20 in a distributed manner, whereby it is possible to prevent a high load from being applied to the IGBT 18 and the IGBT 20. At the turn-off timing tf (for example, the turn-off timing tf3 of FIG. 4), the IGBT 18 and the IGBT 20 are turned off together. In this case, the size of the region to be turned off in the semiconductor substrate 100 becomes the total area of the area of the IGBT 18 and the area of the IGBT 20 of FIG. 3. That is, in this case, the size of the region to be turned off is large. However, in a case where the current Ic is large, there is mostly no correspondence relationship between the size of the IGBT to be turned off and the turn-off loss. Accordingly, in this way, even if the IGBT 18 and the IGBT 20 are turned off simultaneously, the turn-off loss does not increase compared to a case where only one of the IGBT 18 and the IGBT 20 is turned off. In this way, in a case where the current Ic is large, the IGBTs 18, 20 are turned on together in the turn-on period Ton, whereby it is possible to reduce the loads of the IGBTs 18, 20 without increasing the turn-off loss.

As will be apparent from the above-described description, in the switching circuit 16, the electric conduction time of the IGBT 18 (that is, the time for which the IGBT 18 is turned on) is longer than the electric conduction time of the IGBT 20. As shown in FIG. 3, the IGBT 20 is formed in a central portion of the semiconductor substrate 100, and the IGBT 18 is formed in the periphery of the IGBT 20. The IGBT 18 which is on the outer circumference of the semiconductor substrate 100 has higher heat dissipation performance than the IGBT 20 formed in the central portion. In this way, the electric conduction time of the IGBT 18 having high heat dissipation performance is made long, whereby it is possible to suitably suppress an increase in temperature of the semiconductor substrate 100.

In the switching circuit 16 of Example 1, it is possible to obtain an effect of distributing the loads of the IGBTs 18, 20. Hereinafter, details will be described.

If a control amplifier for controlling the gate of the PMOS 51 and a control amplifier for controlling the gate of the PMOS 52 are provided separately, a difference may occur between a drive signal which is applied of the gate of the PMOS 51 and a drive signal which is applied to the gate of the PMOS 52. For example, a difference may occur between the falling timings of the drive signals or in the magnitude of the potential. In the both-side control procedure, if the falling timing (for example, the timing at which the drive signal VP1 of FIG. 4 falls from the potential Voff2 to the potential Von2) of the drive signal is different between the PMOS 51 and the PMOS 52, deviation occurs between the turn-on timings of the PMOS 51 and the PMOS 52. Accordingly, deviation occurs between the turn-on timings of the IGBT 18 and the IGBT 20. If one IGBT is turned on earlier than the other IGBT, a high current flows instantaneously in the IGBT turned on early, and a high load is applied to the IGBT turned on early. As in Example 1, in a case of measuring the gate potentials Vg18, Vg20 and performing the feedback control, in the turn-on period Ton of the both-side control procedure, a difference may occur in the magnitude (for example, the potential Von2 of the drive signal VP1 of FIG. 4) of the drive signal between the PMOS 51 and the PMOS 52, and a difference may occur between the gate potential Vg18 and the gate potential Vg20. If the gate potential of one IGBT is higher than the gate potential of the other IGBT, a current flows in the IGBT having a high gate potential unevenly, and a high load is applied to this IGBT.

In contrast, in Example 1 described above, in the both-side control procedure, the drive signal VP1 applied to the single output terminal 92a is applied to the gate of the PMOS 51 and the gate of the PMOS 52. That is, a difference hardly occurs in the waveform of the drive signal VP1 applied to the gate between the PMOS 51 and the PMOS 52. For this reason, deviation hardly occurs between the turn-on timing of the PMOS 51 and the turn-on timing of the PMOS 52. For this reason, deviation hardly occurs between the turn-on timing of the IGBT 18 and the turn-on timing of the IGBT 20. In the turn-on period Ton of the both-side control procedure, a difference hardly occurs in the magnitude of the gate potential between the PMOS 51 and the PMOS 52. For this reason, a difference hardly occurs between the gate potential Vg18 and the gate potential Vg20. Accordingly, in the turn-on period Ton of the both-side control procedure, the current Ic flows in the IGBT 18 and the IGBT 20 in a substantially evenly distributed manner. Therefore, according to the configuration of Example 1, it is possible to prevent a load from being biased to one IGBT and to obtain a load distribution effect.

A switching circuit of Example 2 has the same configuration of the switching circuit 16 of FIG. 2. However, in Example 1 and Example 2, a measurement circuit for the gate potentials and the gate currents of the IGBTs 18, 20 is different. In Example 1, each of the gate potential of the IGBT 18, the gate current of the IGBT 18, the gate potential of the IGBT 20, and the gate current of the IGBT 20 is measured by the control amplifier 92. In contrast, in Example 2, a measurement is performed by a measurement circuit 150 shown in FIG. 5.

The measurement circuit 150 has a resistor 151 and a resistor 153. The gate of the IGBT 18 and the gate of the IGBT 20 are connected through the resistor 151 and the resistor 153. The resistor 151 and the resistor 153 are connected in series between the gate of the IGBT 18 and the gate of the IGBT 20. Electric resistance $R_{151}$ of the resistor 151 and electric resistance $R_{153}$ of the resistor 153 are equal. A wiring 156 between the resistor 151 and the resistor 153 is connected to the control amplifier 92. A potential $V_{156}$ of the wiring 156 becomes a potential ($V_{156}=(R_{153}Vg18+R_{151}Vg20)/(R_{151}+R_{153})$) obtained by dividing the gate potential Vg18 of the IGBT 18 and the gate potential Vg20 of the IGBT 20. In particular, in this example, since the resistor 151 and the resistor 153 have the same electric resistance, the potential $V_{156}$ of the wiring 156 becomes an average value of the gate potential Vg18 and the gate potential Vg20. The potential $V_{156}$ of the wiring 156 is measured by the control amplifier 92.

The measurement circuit 150 has a resistor 152 and a resistor 154. A end portion 32a of the gate resistor 32 positioned on a side opposite to the gate of the IGBT 18 and an end portion 34a of the gate resistor 34 positioned on a side opposite to the gate of the IGBT 20 are connected through the resistor 152 and the resistor 154. The resistor 152 and the resistor 154 are connected in series between the end portion 32a and the end portion 34a. The resistor 152 and the resistor 154 have the same electric resistance. A wiring 158 between the resistor 152 and the resistor 154 is connected to the control amplifier 92. A potential $V_{158}$ of the wiring 158 becomes a potential ($V_{158}=(R_{154}V32+R_{152}V34)/(R_{152}+R_{154})$) obtained by dividing a potential V32 of the end portion 32a and a potential V34 of the end portion 34a. In particular, in this example, since the resistor 152 and the resistor 154 have the same electric resistance, the potential $V_{158}$ of the wiring 158 becomes an average value of the potential V32 and the potential V34. The potential $V_{158}$ of the wiring 158 is measured by the control amplifier 92.

If the potential $V_{156}$ and the potential $V_{158}$ are detected, the control amplifier 92 calculates a potential difference ΔV (that is, $V_{156}-V_{158}$) therebetween. The potential difference ΔV is proportional to an average value of the gate current of the IGBT 18 and the gate current of the IGBT 20. The control amplifier 92 controls the potential Von2 based on the potential $V_{156}$ (that is, the average value of the gate potentials Vg18, Vg20) and the potential difference ΔV (that is, the average value of the gate currents of the IGBTs 18, 20) in the turn-on period Ton of the both-side control procedure. With this, the feedback control of the gate potentials Vg18, Vg20 of the IGBTs 18, 20 is accurately performed in the turn-on period Ton.

In this way, according to the measurement circuit 150 of Example 2, the values (in particular, in this example, the average value) obtained by averaging the gate potentials and the gate currents of the IGBTs 18, 20 are measured by the control amplifier 92. It is possible to simplify the configurations of the measurement circuit 150 and the control amplifier 92 compared to a case where each of the gate potential of the IGBT 18, the gate current of the IGBT 18, the gate potential of the IGBT 20, and the gate current of the IGBT 20 is measured.

Figure 5:
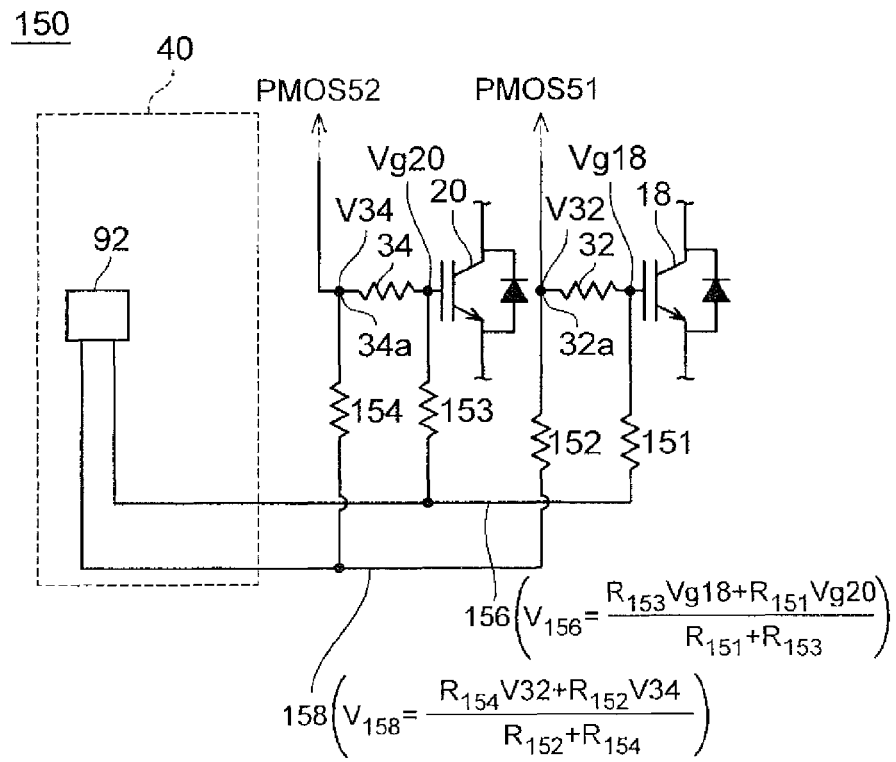
FIG. 5 is a circuit diagram of a gate potential measurement circuit of Example 2.
Figure 6:
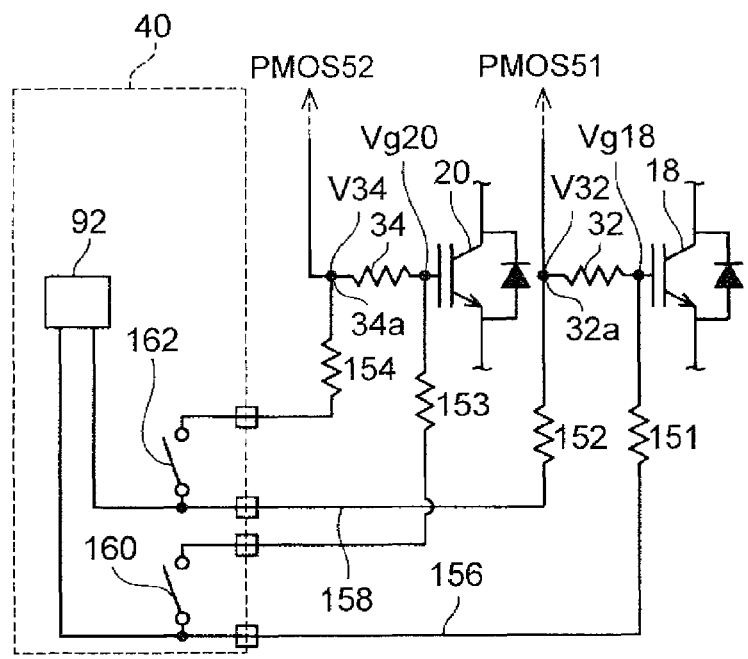
FIG. 6 is a circuit diagram of a gate potential measurement circuit of Example 3.

A switching circuit of Example 3 is different from Example 2 (FIG. 5) in that, as shown in FIG. 6, a measurement circuit has switches 160, 162. Other configurations of Example 3 are the same as those in Example 2.

As shown in FIG. 6, in Example 3, the resistor 153 is connected to the wiring 156 through the switch 160. The resistor 154 is connected to the wiring 158 through the switch 162. The switches 160, 162 are formed inside the gate control IC 40.

The switching circuit of Example 3 maintains the switches 160, 162 to be on in the both-side control procedure. Accordingly, as in Example 2, the potentials $V_{156}$, $V_{158}$ are measured by the control amplifier 92.

The switching circuit of Example 3 maintains the switches 160, 162 to be off in the one-side control procedure. Since the switch 160 is maintained to be off, a leak current is prevented from flowing from the gate of the IGBT 18 toward the gate of the IGBT 20 through the resistors 151, 153. Since the switch 162 is maintained to be off, a leak current is prevented from flowing from the gate of the IGBT 18 toward the gate of the IGBT 20 through the resistors 152, 154. In the one-side control procedure, the potential of the wiring 156 becomes the potential Vg18, and the potential of the wiring 158 becomes the potential V32. The difference between the potential Vg18 and the potential V32 is proportional to the gate current of the IGBT 18. Therefore, in the one-side control procedure, the control amplifier 92 can measure the gate potential and the gate current of the IGBT 18.

A switching circuit of Example 4 has the same configuration as the switching circuit of Example 1 shown in FIG. 2. As in Example 1, the switching circuit of Example 4 executes the both-side control procedure in a case where the current Ic is large. That is, in a case where the current Ic is large, both of the IGBT 18 and the IGBT 20 are turned on in the turn-on period Ton, and both of the IGBT 18 and the IGBT 20 are turned off in the turn-off period Toff. In the switching circuit of Example 4, a control method in a case where the current Ic is small is different from the control method of Example 1.

Figure 7:
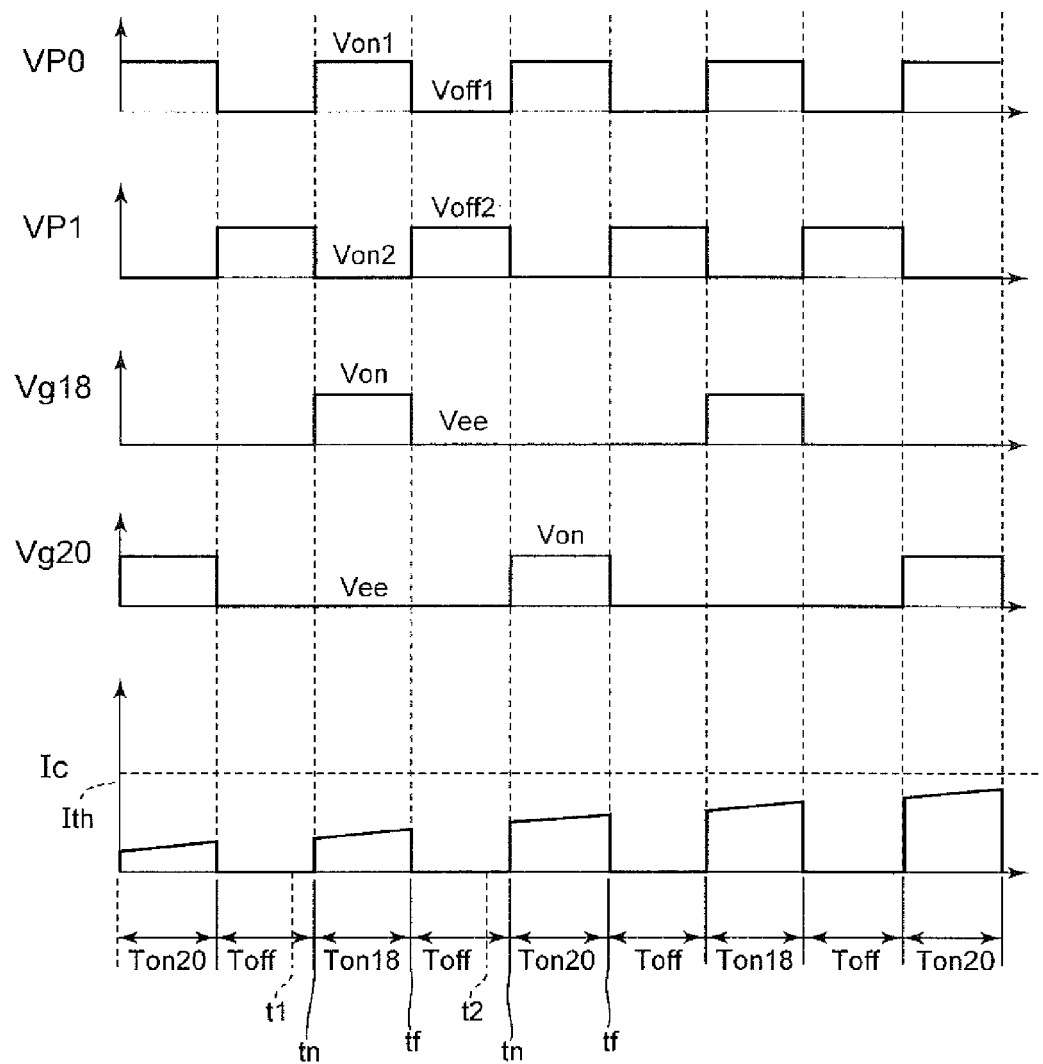
FIG. 7 is a graph showing change with time of each value in a one-side control procedure of Example 4.

The switching circuit of Example 4 performs the one-side control procedure as shown in FIG. 7 in a case where the current Ic is small. That is, in a case where the current Ic is small, the logic circuit 90 controls the IGBTs 18, 20 such that a turn-on period Ton18 during which only the IGBT 18 is turned on and a turn-on period Ton20 during which only the IGBT 20 is turned on alternately appear. Specifically, control is performed such that the turn-on period Ton18, the turn-off period Toff, the turn-on period Ton20, and the turn-off period Toff repeatedly appear in this order. In the turn-off period Toff, the IGBT 18 and the IGBT 20 are turned off together. For example, at a timing t1 of FIG. 7, the logic circuit 90 determines that the current Ic is smaller than the threshold Ith in the last turn-on period Ton20. Then, in the next turn-on period Ton18, the logic circuit 90 brings the IGBT 18 into the on state and maintains the IGBT 20 in the off state. Since the current Ic has not increased to the threshold Ith in the turn-on period Ton18, at the timing t2, the logic circuit 90 determines that the current Ic is smaller than the threshold Ith in the last turn-on period Ton18. Then, in the next turn-on period Ton20, the logic circuit 90 brings the IGBT 20 into the on state and maintains the IGBT 18 in the off state. In this way, the logic circuit 90 turns on the IGBT, which is not the IGBT turned on the last turn-on period Ton, between the IGBTs 18, 20 in the next turn-on period Ton. For this reason, while the current Ic is small, the IGBT 18 and the IGBT 20 are alternately turned on. In this case, the IGBT 18 and the IGBT 20 are alternately turned on, it is possible to distribute heat occurring in the semiconductor substrate 100. With this, it is possible to suppress an increase in temperature of the semiconductor substrate 100. Even in this configuration, in a case where the current Ic is small, since the IGBT 18 or the IGBT 20 is turned off alone at the turn-off timing tf, it is possible to reduce the turn-off loss.

In the one-side control procedure of FIG. 7, the processing for turning on the IGBT 18 alone is executed in the same manner as in Example 1. In the one-side control procedure of FIG. 7, in a case where the IGBT 20 is turned on alone, in a state where the switch S1 is turned off, the switch S2 is turned on, the switch S3 is turned on, and the switch S4 is turned off, the drive signal VP1 is decreased from the high potential Voff2 to the low potential Von2. Then, while the PMOS 51 is maintained to be off, the PMOS 52 is turned on. Simultaneously, while the NMOS 71 is maintained to be on, the NMOS 72 is turned off. Then, the gate of the IGBT 20 is charged through the PMOS 52, and the IGBT 20 is turned on alone. In the one-side control procedure of FIG. 7, in a case where the IGBT 20 is turned off alone, in a state where the switch S1 is turned off, the switch S2 is turned on, the switch S3 is turned on, and the switch S4 is turned off, the drive signal VP1 is decreased from the low potential Von2 to the high potential Voff2. Then, the PMOS 51 is maintained to be off, and the PMOS 52 is turned off. Simultaneously, while the NMOS 71 is maintained to be on, the NMOS 72 is turned on. Then, the gate of the IGBT 20 is discharged through the NMOS 72, and the IGBT 20 is turned off alone.

A switching circuit of Example 5 has the same configuration as the switching circuit of Example 1 shown in FIG. 2. The switching circuit of Example 5 executes the both-side control procedure in the same manner as in Example 1 in a case where the current Ic is large. In the switching circuit of Example 5, a control method in a case where the current Ic is small is different from the control method of Example 1.

Figure 8:
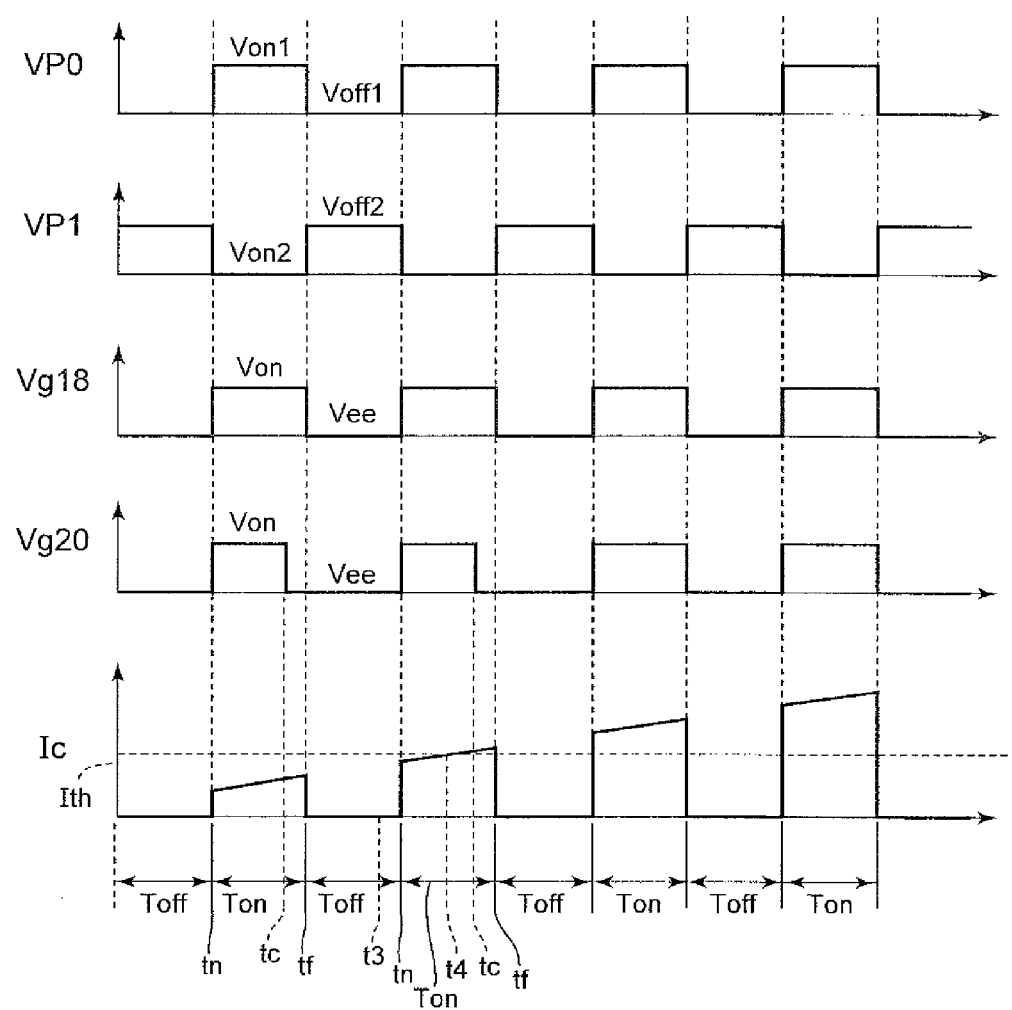
FIG. 8 is a graph showing change with time of each value in a one-side control procedure and a both-side control procedure of Example 5.

The switching circuit of Example 5 performs a one-side control procedure shown in FIG. 8 in a case where the current Ic is small. Even in a case where the current Ic is small, the logic circuit 90 turns on both of the IGBT 18 and the IGBT 20 at the turn-on timing tn. At a timing tc immediately before the turn-off timing tf, the IGBT 20 is turned off. Thereafter, the logic circuit 90 maintains the IGBT 20 in the off state until the next turn-on timing tn (that is, until the turn-off timing tf elapses). Accordingly, at the turn-off timing tf, the IGBT 18 is turned off alone. For example, at a timing t3 of FIG. 8, the logic circuit 90 determines that the current Ic is smaller than the threshold Ith at the last turn-on period Ton. Then, at the next turn-on timing tn, the logic circuit 90 turns on the IGBT 18 and the IGBT 20 together. At the timing tc before the turn-off timing tf, the IGBT 20 is turned off. The IGBT 20 is maintained in the off state until the turn-off timing tf elapses. At the timing tc, the IGBT 18 is not turned off and is maintained in the on state. At the subsequent turn-off timing tf, the IGBT 18 is turned off. Accordingly, at the turn-off timing tf, the IGBT 18 is turned off alone. In this way, in Example 5, in a case where the current Ic is small, while the IGBTs 18, 20 are turned on together at a part of the turn-on period Ton, the IGBT 20 is turned off earlier than the IGBT 18.

In the above-described control, the IGBT 20 is turned off at the timing tc, and the IGBT 18 is maintained in the on state. Even if the IGBT 20 is turned off, since the IGBT 18 is turned on, the collector-emitter voltage of the IGBT 20 is maintained at a low voltage. Accordingly, when the IGBT 20 is turned off, the turn-off loss does not occur. When the IGBT 18 is turned off at the turn-off timing tf, the IGBT 18 is turned off, whereby the collector-emitter voltage of the IGBT 18 increases. Accordingly, at the turn-off timing tf, the turn-off loss occurs. However, at the turn-off timing tf, since the IGBT 18 is turned off alone, the turn-off loss is small. Accordingly, in the switching circuit of Example 5, it is also possible to reduce the turn-off loss. In this way, even in a case where the current Ic is small, the current Ic is distributed to the IGBTs 18, 20 in a part of the turn-on period Ton, whereby it is possible to further reduce the loads of the IGBTs 18, 20. With this, it is possible to suppress an increase in temperature of the semiconductor substrate 100.

At the turn-on timing tn of the one-side control procedure of FIG. 8, the processing for turning on the IGBTs 18, 20 simultaneously is executed in the same manner as at the turn-on timing tn of the both-side control procedure. At the timing tc of the one-side control procedure of FIG. 8, the processing for turning on the IGBT 20 alone is performed by turning off the switch S2, turning on the switch S4, and turning on the NMOS 72 while maintaining the PMOS 51 to be on and maintaining the NMOS 71 to be off. The switch S2 is turned off and the switch S4 is turned on, whereby the PMOS 52 is turned off. The PMOS 52 is turned off and the NMOS 72 is turned on, whereby the IGBT 20 is turned off Since the PMOS 51 is maintained to be on and the NMOS 71 is maintained to be off, the IGBT 18 is maintained to be on. That is, at the timing tc, the IGBT 20 is turned off alone. At the turn-off timing tf of the one-side control procedure of FIG. 8, the processing for turning off the IGBT 18 alone is executed in the same manner as in the one-side control procedure of Example 1.

In Example 5 described above, the logic circuit 90 performs the determination relating to the current Ic at the timing (for example, the timing t3) in the turn-off period Toff. However, in Example 5, the determination relating to the current Ic may be performed at the timing (for example, a timing t4 (that is, the timing before the timing tc at which the IGBT 20 is turned off)) in the turn-on period Ton. In this case, it is possible to perform the determination based on the current Ic at the point of time of the timing t4.

In Example 5 described above, it is preferable that a delay time between the timing tc at which the IGBT 20 is turned off and the turn-off timing tf at which the IGBT 18 is turned off is a sufficient time to reduce the carriers in the region of the IGBT 20 of the semiconductor substrate 100. On the other hand, it is preferable that the delay time is equal to or less than 10% of the turn-on period Ton in order to minimize the influence on the control.

In Example 5 described above, the IGBT 18 and the IGBT 20 are turned on simultaneously at the turn-on timing tn. However, the timing at which the IGBT 20 is turned on may be delayed later than the turn-on timing tn.

A switching circuit of Example 6 has the same configuration as the switching circuit of Example 1 shown in FIG. 2. The switching circuit of Example 6 executes the both-side control procedure in the same manner as in Example 1 in a case where the current Ic is large. In the switching circuit of Example 6, a control method in a case where the current Ic is small is different from the control method of Example 1.

Figure 9:
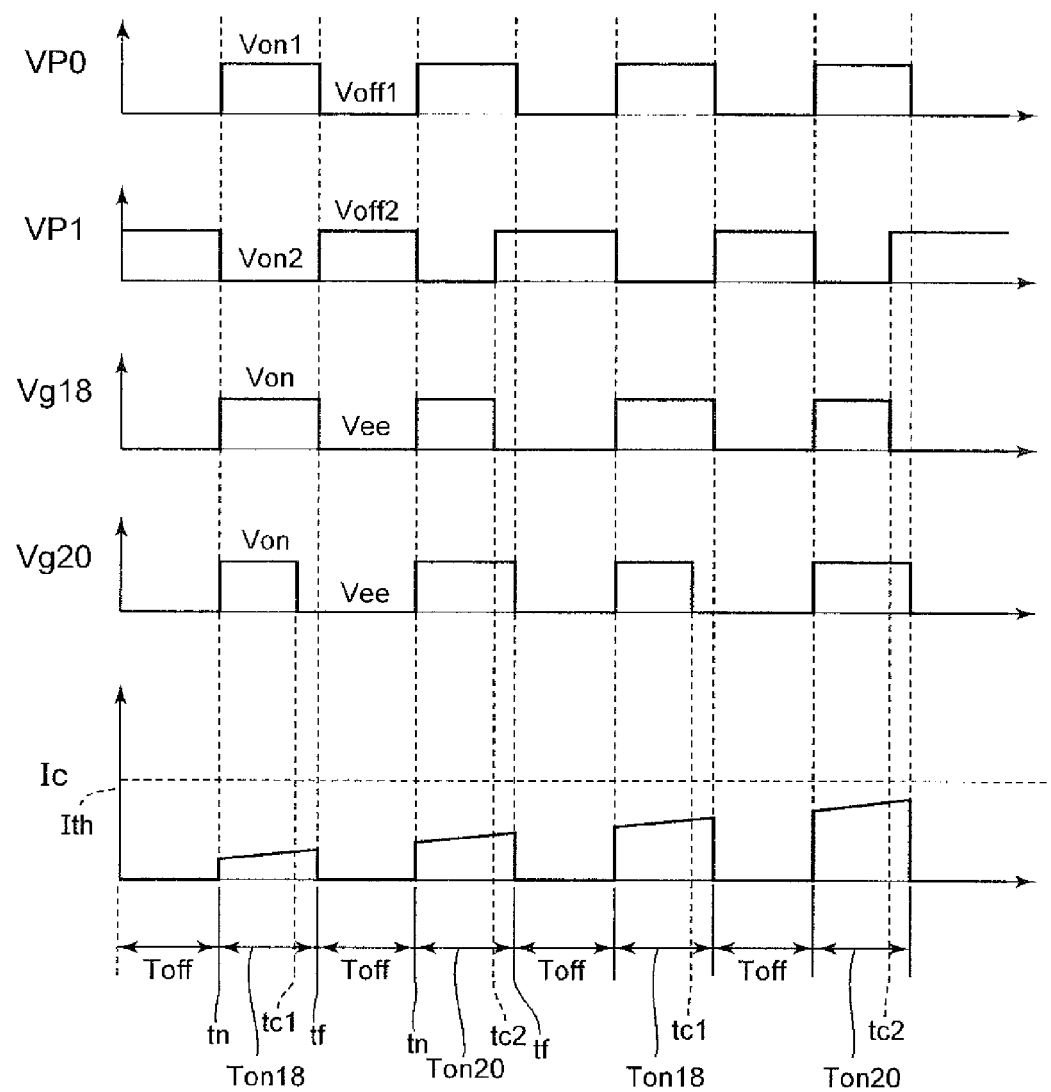
FIG. 9 is a graph showing change with time of each value in a one-side control procedure of Example 6.

The control method of Example 6 in a case where the current Ic is small is a method in which the control method of Example 4 and the control method of Example 5 are combined. In Example 6, in a case where the current Ic is small, a one-side control procedure shown in FIG. 9 is executed. In FIG. 9, control is performed such that the turn-on period Ton18, the turn-off period Toff, the turn-on period Ton20, and the turn-off period Toff repeatedly appear in this order. At the turn-on timing tn, the IGBT 18 and the IGBT 20 are turned on together. In the first half of the turn-on period Ton18, the IGBT 18 and the IGBT 20 are turned on. At a timing tc1 in the middle of the turn-on period Ton18, the IGBT 20 is turned off. The IGBT 18 is turned off at the next turn-off timing tf. At the turn-off period Toff, the IGBT 18 and the IGBT 20 are turned off. At the next turn-on timing tn, the IGBT 18 and the IGBT 20 are turned on together. In the first half of the turn-on period Ton20, the IGBT 18 and the IGBT 20 are turned on. At a timing tc2 in the middle of the turn-on period Ton20, the IGBT 18 is turned off. The IGBT 20 is turned off at the next turn-off timing tf. According to this configuration, since the turn-on period Ton18 during which the electric conduction time of the IGBT 18 is long and the turn-on period Ton20 during which the electric conduction time of the IGBT 20 is long alternately appear, it is possible to distribute heat occurring in the semiconductor substrate 100.

Figure 10:
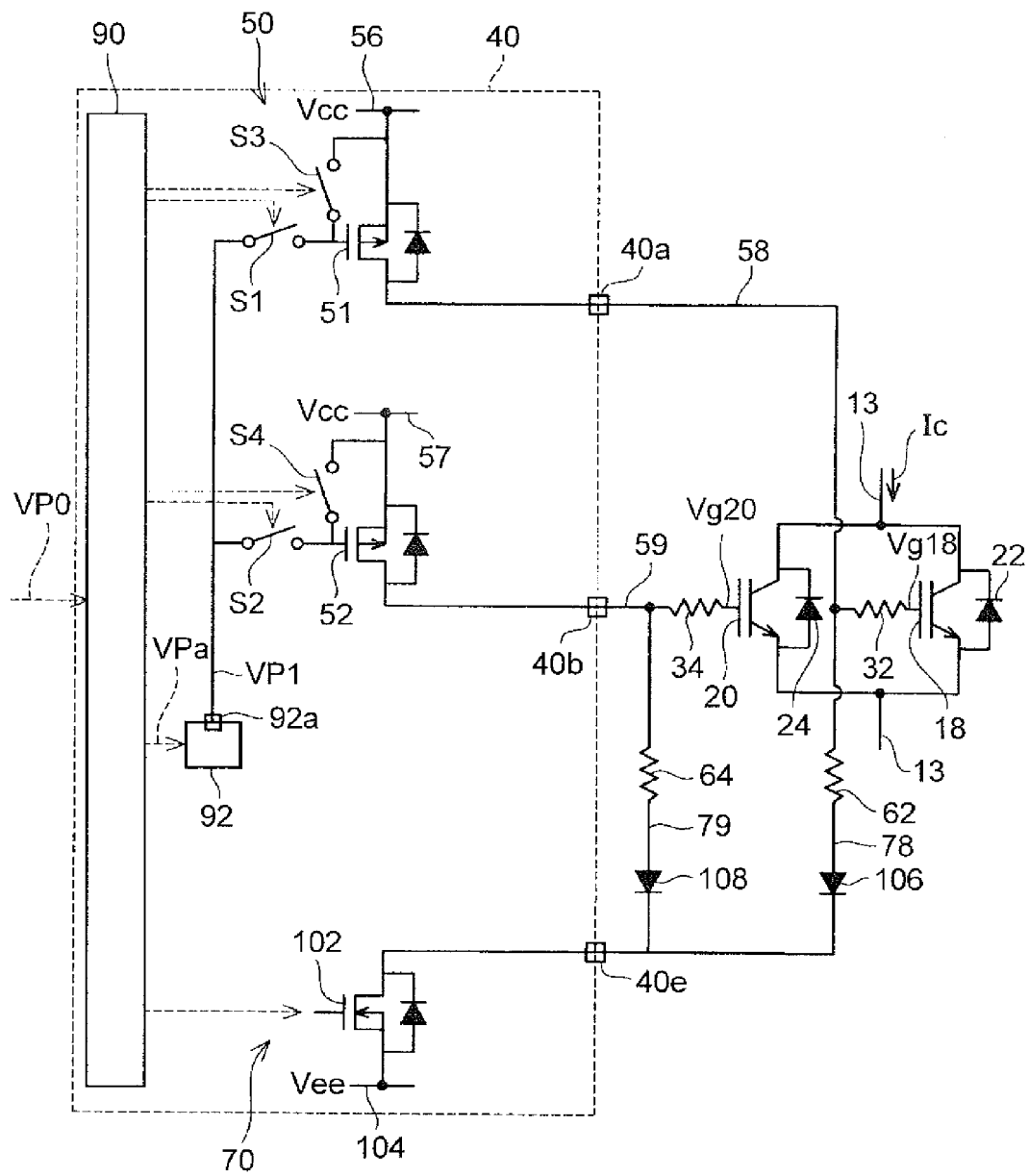
FIG. 10 is a circuit diagram of a switching circuit of Example 7.

A switching circuit of 7 Example shown in FIG. 10 has a gate turn-off circuit 70 having a configuration different from that in Example 1 (FIG. 2). Other configurations of the switching circuit of Example 7 are the same as those in Example 1.

In Example 7, the gate turn-off circuit 70 is constituted of a single NMOS 102. The source of the NMOS 102 is connected to a wiring 104 to which the reference potential Vee is applied. The drain of the NMOS 102 is connected to a terminal 40e. The terminal 40e is connected to the gate of the IGBT 18 through a diode 106, the gate resistor 62, and the gate resistor 32. The cathode of the diode 106 is connected to the terminal 40e, and the anode of the diode 106 is connected to the gate resistor 62. The terminal 40e is connected to the gate of the IGBT 20 through a diode 108, the gate resistor 64, and the gate resistor 34. The cathode of the diode 108 is connected to the terminal 40e, and the anode of the diode 108 is connected to the gate resistor 64. In Example 7, a wiring which connects the drain of the NMOS 71 and the gate of the IGBT 18 is referred to as a gate turn-off wiring 78, and a wiring which connects the drain of the NMOS 71 and the gate of the IGBT 20 is referred to as a gate turn-off wiring 79. The gate of the NMOS 102 is connected to the logic circuit 90. The signal VP2 obtained by inverting the PWM signal is input from the logic circuit 90 to the gate of the NMOS 102.

The switching circuit of Example 7 can execute the operation (the same operation as in Examples 1 and 4) shown in FIGS. 4 and 7. The switching circuit of Example 7 operates as follows. In the turn-on period Ton of the both-side control procedure, the NMOS 102 is maintained to be off. For this reason, the gates of the IGBTs 18, 20 are separated from the potential Vee, and as in Examples 1 and 4 described above, the gates of the IGBTs 18, 20 are charged by the gate turn-on circuit 50. Accordingly, the IGBTs 18, 20 are turned on together. In the turn-off period Toff of the both-side control procedure, the NMOS 102 is turned on, and the PMOSs 51, 52 are turned off. Accordingly, the gates of the IGBTs 18, 20 are connected to the potential Vee, and the gates of the IGBTs 18, 20 are discharged. Therefore, the IGBTs 18, 20 are turned off together.

In the turn-on period Ton of the one-side control procedure, the NMOS 102 is maintained to be off. In the turn-on period Ton of the one-side control procedure, one of the PMOSs 51, 52 is turned on, and the other of the PMOSs 51, 52 is turned off. For example, in a case of turning on the IGBT 18, the low potential Von2 of the drive signal VP1 is applied to the gate of the PMOS 51 in a state where the switch S1 is controlled to be on and the switch S3 is controlled to be off, and thus, the PMOS 51 is turned on. In this case, the gate of the IGBT 18 is separated from the potential Vee by the turn-off of the NMOS 102 and is charged by the turn-on of the PMOS 51. That is, the IGBT 18 is turned on. In this case, the switch S2 is controlled to be off and the switch S4 is controlled to be on, whereby the PMOS 52 is controlled to be off. The gate of the IGBT 20 is separated from the potential Vcc by the turn-off of the PMOS 52. At this time, the NMOS (not shown) which is connected between the gate of the IGBT 20 and the potential Vee is controlled to be on. Accordingly, the gate of the IGBT 20 is maintained at the potential Vee. For this reason, the IGBT 20 is maintained to be off in the turn-on period Ton. In the turn-off period Toff of the one-side control procedure, the NMOS 102 is turned on, and the PMOSs 51, 52 are turned off. Accordingly, the gates of the IGBTs 18, 20 are connected to the potential Vee, and the IGBTs 18, 20 are turned off together. In this way, with the switching circuit of Example 7, it is also possible to switch both of the IGBTs 18, 20 in the both-side control procedure and to switch one of the IGBTs 18, 20 in the one-side control procedure.

According to the configuration of Example 7, in the both-side control procedure, it is possible to turn off the IGBTs 18, 20 using the single NMOS 102. Accordingly, it is possible to prevent deviation between the turn-off timings of the IGBTs 18, 20. With this, it is possible to prevent the current Ic from flowing in one of the IGBTs 18, 20 unevenly due to deviation between the turn-off timings.

In the configuration of Example 7, in the one-side control procedure, it is possible to prevent a leak current from flowing from the gate of one IGBT toward the gate of the other IGBT using the diodes 106, 108. For example, in a case where the gate potential Vg18 of the IGBT 18 is higher than the gate potential Vg20 of the IGBT 20 (that is, in a case where the IGBT 18 is turned on and the IGBT 20 is turned off), it is possible to prevent a leak current from flowing from the gate of the IGBT 18 toward the gate of the IGBT 20 using the diode 108. In a case where the gate potential Vg20 of the IGBT 20 is higher than the gate potential Vg18 of the IGBT 18 (that is, in a case where the IGBT 20 is turned on and the IGBT 18 is turned off), it is possible to prevent a leak current from flowing from the gate of the IGBT 20 toward the gate of the IGBT 18 using the diode 106.

In a switching circuit of Example 8 shown in FIG. 11, an npn bipolar transistor 171 (hereinafter, referred to as a BT 171) is provided instead of the PMOS 51 (see FIG. 2), and an npn bipolar transistor 172 (hereinafter, referred to as a BT 172) is provided instead of the PMOS 52 (see FIG. 2). Other configurations of the switching circuit of Example 8 are the same as those in Example 1 (FIG. 2).

The collector of the BT 171 is connected to the wiring 56. The emitter of the BT 171 is connected to the terminal 40a. The base of the BT 171 is connected to the output terminal 92a of the control amplifier 92 through the switch S1. A resistor 173 is connected between the base and the emitter of the BT 171.

The collector of the BT 172 is connected to the wiring 57. The emitter of the BT 172 is connected to the terminal 40b. The base of the BT 172 is connected to the output terminal 92a of the control amplifier 92 through the switch S2. A resistor 174 is connected between the base and the emitter of the BT 172.

In Example 8, the drive signal VP1 is at a high potential in the turn-on period Ton and is at a low potential in the turn-off period Toff. If the switch S1 is turned on, the drive signal VP1 is applied to the base of the BT 171, and the BT 171 is switched. If the switch S1 is turned off, the base and the emitter of the BT 171 are at the same potential, and the BT 171 is maintained to be off. If the switch S2 is turned on, the drive signal VP1 is applied to the base of the BT 172, and the BT 172 is switched. If the switch S2 is turned off, the base and the emitter of the BT 172 are at the same potential, and the BT 172 is maintained to be off.

In Example 8, it is possible to control the switches S1, S2 and the NMOSs 71, 72 in the same manner as in Examples 1, and 4 to 6. In the turn-on period Ton of the both-side control procedure, the BT 171 and the BT 172 are turned on simultaneously. Since the drive signal VP1 applied to the single output terminal 92a is applied to the base of the BT 171 and the base of the BT 172, there is mostly no difference between the base potential of the BT 171 and the base potential of the BT 172. In the npn bipolar transistor, manufacturing errors for a voltage drop between the base and the emitter are very small. That is, in the both-side control procedure, there is mostly no difference between the voltage drop between the base and the emitter of the BT 171 and the voltage drop between the base and the emitter of the BT 172. For this reason, there is mostly no difference between the emitter potential (that is, the potential V32 of the end portion 32a of the resistor 32) of the BT 171 and the emitter potential (that is, the potential V34 of the end portion 34a of the resistor 34) of the BT 172. As a result, a difference hardly occurs between the gate potential Vg18 of the IGBT 18 and the gate potential Vg20 of the IGBT 20. Accordingly, when the IGBTs 18, 20 are turned on together, it is possible to further decrease deviation between the turn-on timings of the IGBTs 18, 20 compared to Examples 1, and 4 to 6. Therefore, according to Example 8, it is possible to obtain a higher load distribution effect.

Figure 12:
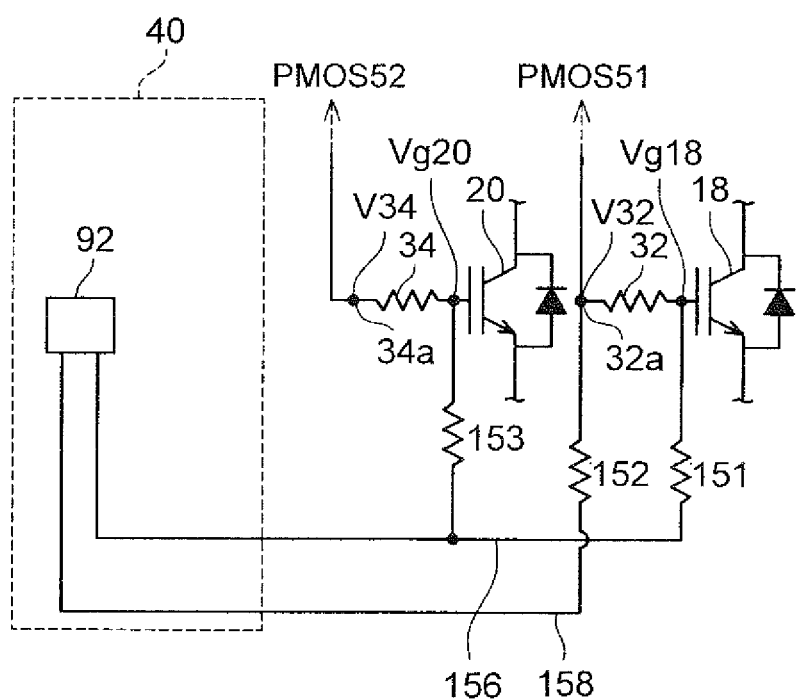
FIG. 12 is a circuit diagram of a gate potential measurement circuit of Example 8.

In Example 8, a measurement circuit shown in FIG. 12 can be used. In FIG. 12, a circuit (a wiring 156 and resistors 151, 153) which measures the gate potentials Vg18, Vg20 has the same configuration as in FIG. 5. On the other hand, the measurement circuit of FIG. 12 has a circuit (a wiring 158 and a resistor 152) which measures the potential V32, but does not have a circuit which measure the potential V34. The control amplifier 92 controls the potential of the drive signal VP1 in the turn-on period Ton based on the potential $V_{156}$ and the potential V32. As described above, in the switching circuit of Example 8, a difference hardly occurs between the potential V32 and the potential V34. Accordingly, if one of the potential V32 and the potential V34 is measured, it is not necessary to measure the other of the potential V32 and the potential V34. Therefore, even if the potential V34 is not detected, it is possible to accurately control the potential of the drive signal VP1. According to this configuration, it is possible to simplify a measurement circuit.

Figure 13:
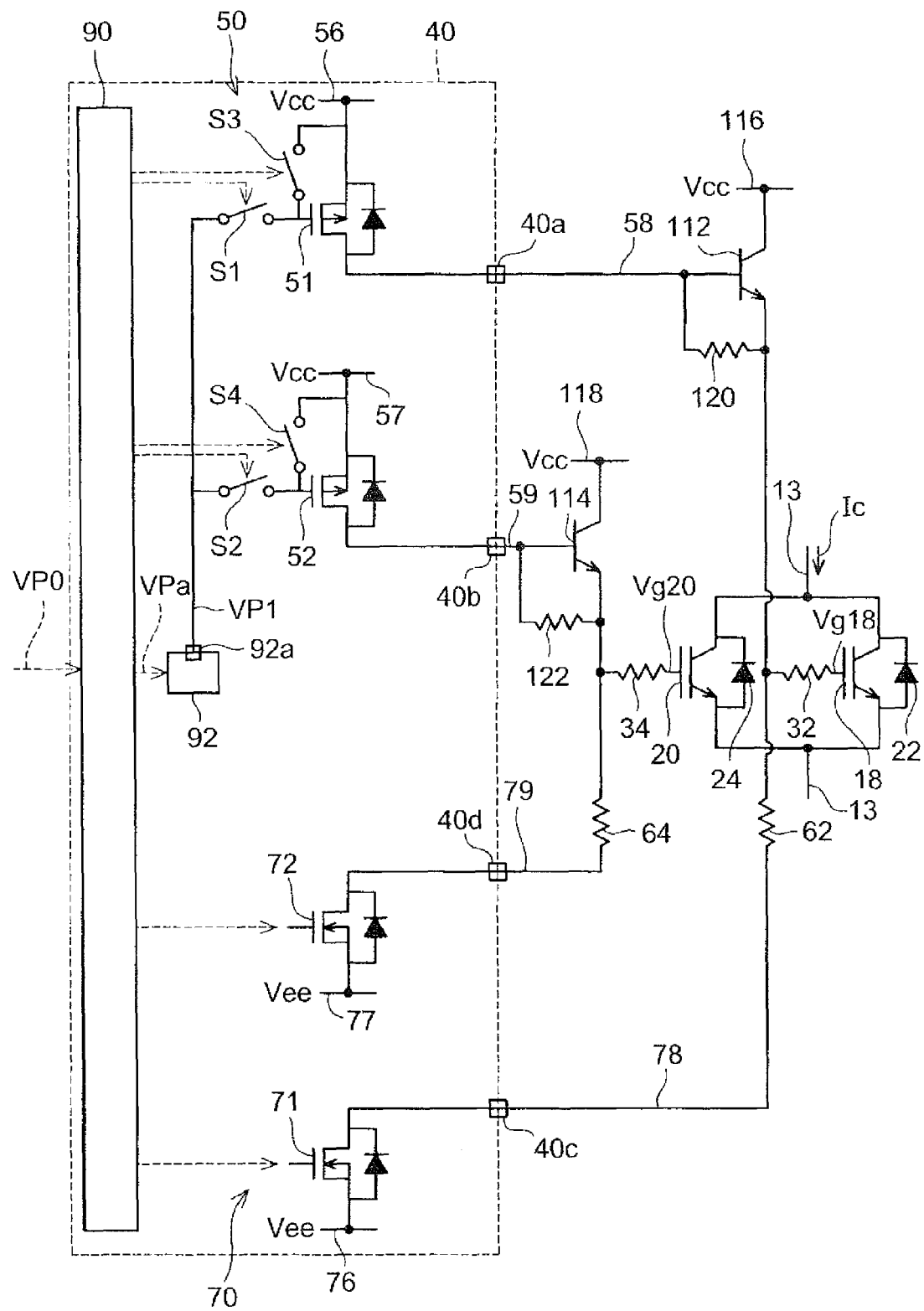
FIG. 13 is a circuit diagram of a switching circuit of Example 9.

A switching circuit of Example 9 shown in FIG. 13 has npn bipolar transistors 112, 114. Other configurations of the switching circuit of Example 9 are the same as those in Example 1 (FIG. 2).

In the switching circuit of Example 9, the drain of the PMOS 51 is connected to the gate of the IGBT 18 through the bipolar transistor 112. Specifically, the drain of the PMOS 51 is connected to the base of the bipolar transistor 112. The collector of the bipolar transistor 112 is connected to a wiring 116 to which the potential Vcc is applied. The emitter of the bipolar transistor 112 is connected to the gate of the IGBT 18 through the gate resistor 32. The base and the emitter of the bipolar transistor 112 are connected by a resistor 120. The bipolar transistor 112 is a discrete component which is provided outside the gate control IC 40.

In the switching circuit of Example 9, the drain of the PMOS 52 is connected to the gate of the IGBT 20 through the bipolar transistor 114. Specifically, the drain of the PMOS 52 is connected to the base of the bipolar transistor 114. The collector of the bipolar transistor 114 is connected to a wiring 118 to which the potential Vcc is applied. The emitter of the bipolar transistor 114 is connected to the gate of the IGBT 20 through the gate resistor 34. The base and the emitter of the bipolar transistor 114 are connected by a resistor 122. The bipolar transistor 114 is a discrete component which is provided outside the gate control IC 40.

In the switching circuit of Example 9, if the PMOS 51 is turned on, the base potential of the bipolar transistor 112 increases, and the bipolar transistor 112 is turned on. As a result, the gate current flows from the wiring 116 to the gate of the IGBT 18 through the bipolar transistor 112 and the gate resistor 32. With this, the IGBT 18 is turned on.

In the switching circuit of Example 9, if the PMOS 52 is turned on, the base potential of the bipolar transistor 114 increases, and the bipolar transistor 114 is turned on. As a result, the gate current flows from the wiring 118 to the gate of the IGBT 20 through the bipolar transistor 114 and the gate resistor 34. With this, the IGBT 20 is turned on.

Figure 11:
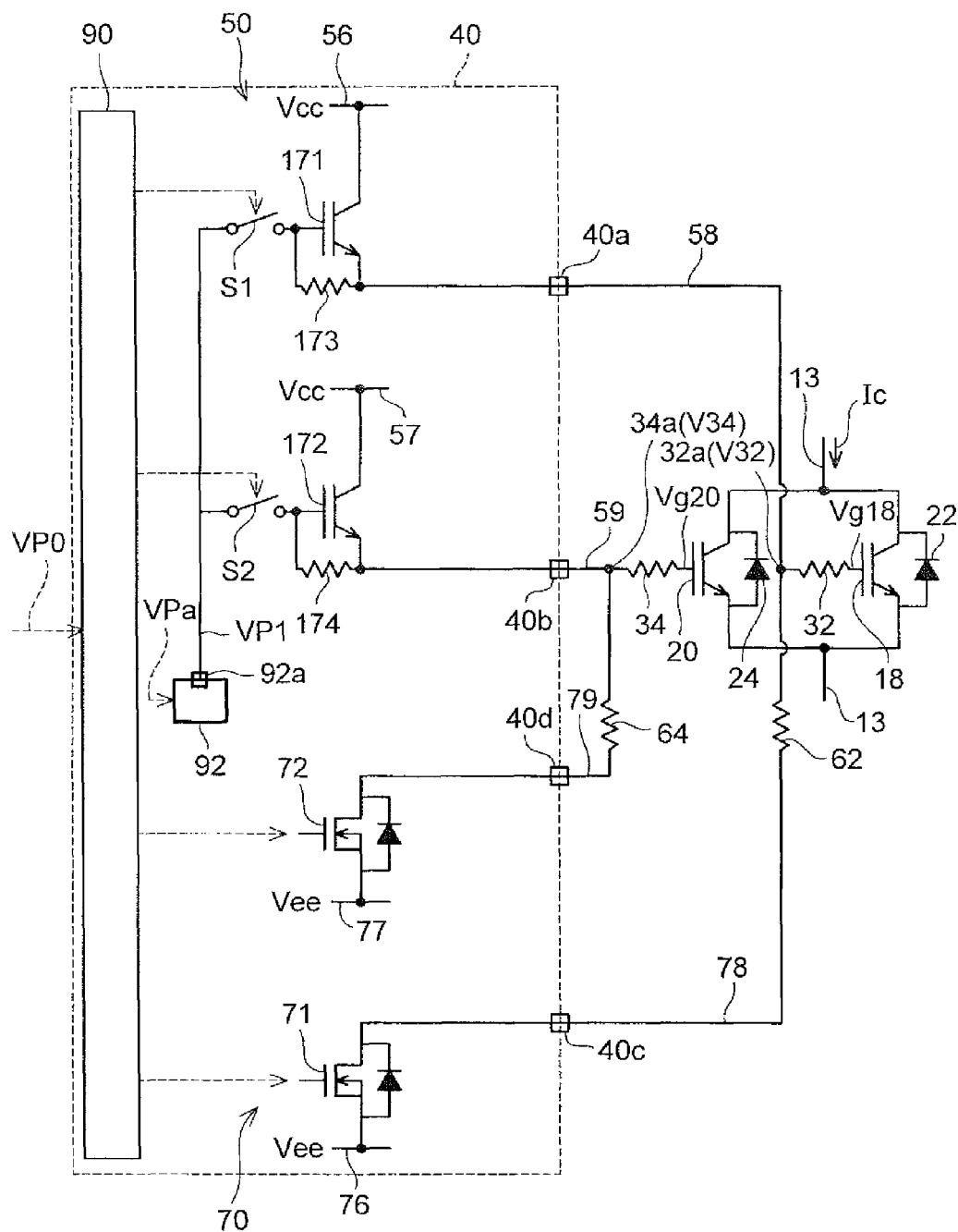
FIG. 11 is a circuit diagram of a switching circuit of Example 8.

The BTs 171, 172 of FIG. 11 may be used instead of the PMOSs 51, 52 of Example 9 (FIG. 13).

As described above, in Example 9, the PMOSs 51, 52 are turned on, whereby the bipolar transistors 112, 114 are turned on, and thus, the IGBTs 18, 20 are turned on. In this way, the PMOSs 51, 52 may be connected to the gates of the IGBTs 18, 20 through other elements.

In all of Examples 1 to 9 described above, when turning on the IGBT 18 and the IGBT 20 simultaneously, the drive signal VP1 applied to the output terminal 92a is applied to the gate of the PMOS 51 and the gate of the PMOS 52. Since there is mostly no difference between the drive signal which is applied to the gate of the PMOS 51 and the drive signal which is applied to the gate of the PMOS 52, it is possible to turn on the PMOS 51 and the PMOS 52 substantially simultaneously. Accordingly, it is possible to turn on the IGBT 18 and the IGBT 20 substantially simultaneously. Since there is mostly no difference between the drive signal which is applied to the gate of the PMOS 51 and the drive signal which is applied to the gate of the PMOS 52, it possible to control the gate potential Vg18 of the IGBT 18 and the gate potential Vg20 of the IGBT 20 to the substantially same potential in the turn-on period Ton. Therefore, it is possible to prevent the current Ic from flowing in one of the IGBT 18 and the IGBT 20 unevenly. In this way, in all of Examples 1 to 9, it is possible to obtain a load distribution effect.

The switching circuit in each of the Examples 1 to 9 described above switches between the second control procedure and the first control procedure according to whether or not the current Ic is greater than the threshold Ith in the last turn-on period Ton. However, a predicted value of the current Ic of the next turn-on period Ton may be calculated based on the current Ic of the last turn-on period Ton, and the second control procedure and the first control procedure may be switched based on the predicted value.

In Examples 1 to 9 described above, the PMOSs 51, 52 and the NMOSs 71, 72 are formed inside the gate control IC 40. However, a part or all of these may be components provided outside the gate control IC 40. In this case, it is possible to make a high current flow in the components provided outside.

In Examples 1 to 9 described above, although the control amplifier 92 measures both of the gate potential and the gate current of the IGBT, the control amplifier 92 may measure only one of the gate potential and the gate current of the IGBT.

Any one of the measurement circuits of FIGS. 5, 6, and 12 described above may be combined with the circuit of any one of FIGS. 2, 10, 11, and 13. The gate turn-off circuit 70 of any one of FIGS. 2, 10, 11, and 13 may be combined with the gate turn-on circuit 50 of any of FIGS. 2, 10, 11, and 13.

The IGBT 18 of Examples is an example of a first IGBT. The IGBT 20 of Examples is an example of a second IGBT. The wiring 13 of Examples is an example of a wiring in which a parallel circuit is inserted. The gate control IC 40, the gate resistors 32, 34, 62, 64, the diodes 106, 108, and the BTs 112, 114, and the like of Examples are an example of a gate control circuit. The PMOS 51 of Examples is an example of a first switching element. The gate of the PMOS 51 of Examples is an example of a first control electrode. The source of the PMOS 51 of Examples is an example of a first principal electrode. The drain of the PMOS 51 of Examples is an example of a second principal electrode. The PMOS 52 of Examples is an example of a second switching element. The gate of the PMOS 52 of Examples is an example of a second control electrode. The source of the PMOS 52 of Examples is an example of a third principal electrode. The drain of the PMOS 52 of Examples is an example of a fourth principal electrode. The BT 171 of Examples is an example of a first switching element. The base of the BT 171 of Examples is an example of a first control electrode. The collector of the BT 171 of Examples is an example of a first principal electrode. The emitter of the BT 171 of Examples is an example of a second principal electrode. The BT 172 of Examples is an example of a second switching element. The base of the BT 172 of Examples is an example of a second control electrode. The collector of the BT 172 of Examples is an example of a third principal electrode. The emitter of the BT 172 of Examples is an example of a fourth principal electrode. The potential Vcc of Examples is an example of a potential higher than a gate threshold of the first IGBT, and is an example of a potential higher than a gate threshold of the second IGBT. The switch S1 of Examples is an example of a first switch. The switch S2 of Examples is an example of a second switch. The control amplifier 92 and the logic circuit 90 of Examples are an example of a control device. The output terminal 92a of Examples is an example of an output terminal. The both-side control procedure of Examples is an example of a first control procedure. The one-side control procedure of Examples is an example of a second control procedure. The resistors 151, 152 of Examples are an example of a first resistor. The resistors 153, 154 of Examples are an example of a second resistor. The diode 106 of Examples is an example of a first diode. The diode 108 of Examples is an example of a second diode. The NMOS 102 of Examples is an example of a third switching element. The gate of the NMOS 102 of Examples is an example of a third control electrode. The drain of the NMOS 102 of Examples is an example of a fifth principal electrode. The source of the NMOS 102 of Examples is an example of a sixth principal electrode. The potential Vee of Examples is an example of a potential lower than the gate threshold of the first IGBT and the gate threshold of the second IGBT.

Technical elements disclosed in this specification are listed below. The respective technical elements are useful independently.

The switching circuit of an example disclosed in this specification further has a first resistor and a second resistor which are connected in series between the gate of a first IGBT and the gate of a second IGBT. A control device controls a potential of a control signal based on a potential of a wiring between the first resistor and the second resistor when both of the first IGBT and the second IGBT are turned on.

The potential of the wiring between the first resistor and the second resistor becomes a voltage obtained by dividing a gate potential of the first IGBT and a gate potential of the second IGBT. The potential of the control signal when both of the first IGBT and the second IGBT are turned on is controlled based on this potential, whereby it is possible to accurately control the gate potentials of the IGBTs without measuring the gate potential of the first IGBT and the gate potential of the second IGBT individually.

In the switching circuit of an example disclosed in this specification, a first switching element and a second switching element are npn bipolar transistors.

Manufacturing errors for a voltage drop between the base and the emitter of the npn bipolar transistor are small. Accordingly, with this configuration, when both of the first IGBT and the second IGBT are turned on, it is possible to further decrease the difference between the gate potential of the first IGBT and the gate potential of the second IGBT. Therefore, it is possible to further suppress deviation between the turn-on timings of the first IGBT and the second IGBT.

The switching circuit of an example disclosed in this specification further includes a first diode, a second diode, and a third switching element. The anode of the first diode is connected to the gate of the first IGBT. The anode of the second diode is connected to the gate of the second IGBT. The third switching element includes a fifth principal electrode, a sixth principal electrode, and a third control electrode, the fifth principal electrode and the sixth principal electrode are turned on or off according to a potential of the third control electrode, the fifth principal electrode is connected to the cathode of the first diode and the cathode of the second diode, and the sixth principal electrode is connected to a potential lower than the gate threshold of the first IGBT and the gate threshold of the second IGBT.

According to this configuration, the third switching element is turned on in a state where the first IGBT and the second IGBT are turned on together, whereby it is possible to turn off the first IGBT and the second IGBT together. Even in a state where one of the first IGBT and the second IGBT is turned on, the third switching element is turned on, whereby it is possible to turn off one IGBT. In a state where one of the first IGBT and the second IGBT is turned on, a leak current flowing from the gate of one IGBT toward the gate of the other IGBT is prevented by the first diode and the second diode.

What is claimed is:
1. A switching circuit comprising:
a first IGBT;
a second IGBT;
a wiring configured to connect the first IGBT and the second IGBT in parallel;
a first resistor;
a second resistor, the first resistor and the second resistor being connected in series between a gate of the first IGBT and a gate of the second IGBT; and
a gate control circuit configured to switch the first IGBT and the second IGBT by controlling a gate potential of the first IGBT and a gate potential of the second IGBT, the gate control circuit including:
a first switching element including a first principal electrode, a second principal electrode, and a first control electrode, the first switching element being configured to switch on and off states of the first principal electrode and the second principal electrode according to a potential of the first control electrode, a potential of the first principal electrode being higher than a gate threshold of the first IGBT, and the first switching element being configured to control the gate potential of the first IGBT according to a potential of the second principal electrode;
a second switching element including a third principal electrode, a fourth principal electrode, and a second control electrode, the second switching element being configured to switch on and off states of the third principal electrode and the fourth principal electrode according to a potential of the second control electrode, a potential of the third principal electrode being higher than a gate threshold of the second IGBT, and the second switching element being configured to control the gate potential of the second IGBT according to a potential of the fourth principal electrode;
a first switch connected to the first control electrode;
a second switch connected to the second control electrode; and
a control device having an output terminal connected to the first control electrode through the first switch and connected to the second control electrode through the second switch, the control device being configured to apply a control signal for switching the first switching element and the second switching element to the output terminal, the control device controlling a potential of the control signal based on a potential of the wiring between the first resistor and the second resistor when both of the first IGBT and the second IGBT are turned on,
wherein the gate control circuit is configured to execute a first control procedure when a current flowing in the wiring is greater than a threshold, the first control procedure being executed so as to turn on both of the first IGBT and the second IGBT at a turn-on timing, and to turn off both of the first IGBT and the second IGBT at a turn-off timing,
the gate control circuit is configured to execute a second control procedure when the current flowing in the wiring is smaller than the threshold, the second control procedure being executed so as to turn on a first target IGBT at the turn-on timing, to turn off the first target IGBT at the turn-off timing, and to turn off a second target IGBT prior to the turn-off timing, the first target IGBT being one of the first IGBT and the second IGBT, the second target IGBT being the other of the first IGBT and the second IGBT,
the gate control circuit is configured to apply the control signal to the output terminal while the first switch and the second switch are turned on when switching both of the first IGBT and the second IGBT, and
the gate control circuit is configured to apply the control signal to the output terminal while one of the first and second switches for controlling the first target IGBT is turned on and the other of the first and second switches for controlling the second target IGBT is turned off when switching the first target IGBT without switching the second target IGBT.

2. The switching circuit according to claim 1, wherein the first switching element and the second switching element are npn bipolar transistors.

3. A switching circuit comprising:
a first IGBT;
a second IGBT;
a wiring configured to connect the first IGBT and the second IGBT in parallel;
a first diode having an anode connected to a gate of the first IGBT;
a second diode having an anode connected to a gate of the second IGBT; and
a gate control circuit configured to switch the first IGBT and the second IGBT by controlling a gate potential of the first IGBT and a gate potential of the second IGBT, the gate control circuit including:
a first switching element including a first principal electrode, a second principal electrode, and a first control electrode, the first switching element being configured to switch on and off states of the first principal electrode and the second principal electrode according to a potential of the first control electrode, a potential of the first principal electrode being higher than a gate threshold of the first IGBT, and the first switching element being configured to control the gate potential of the first IGBT according to a potential of the second principal electrode;
a second switching element including a third principal electrode, a fourth principal electrode, and a second control electrode, the second switching element being configured to switch on and off states of the third principal electrode and the fourth principal electrode according to a potential of the second control electrode, a potential of the third principal electrode being higher than a gate threshold of the second IGBT, and the second switching element being configured to control the gate potential of the second IGBT according to a potential of the fourth principal electrode;
a third switching element including a fifth principal electrode, a sixth principal electrode, and a third control electrode, the third switching element being configured to switch on and off states of the fifth principal electrode and the sixth principal electrode according to a potential of the third control electrode, the fifth principal electrode being connected to a cathode of the first diode and a cathode of the second diode, and a potential of the sixth principal electrode being lower than the gate threshold of the first IGBT and the gate threshold of the second IGBT;
a first switch connected to the first control electrode;
a second switch connected to the second control electrode; and
a control device having an output terminal connected to the first control electrode through the first switch and connected to the second control electrode through the second switch, the control device being configured to apply a control signal for switching the first switching element and the second switching element to the output terminal,
wherein the gate control circuit is configured to execute a first control procedure when a current flowing in the wiring is greater than a threshold, the first control procedure being executed so as to turn on both of the first IGBT and the second IGBT at a turn-on timing, and to turn off both of the first IGBT and the second IGBT at a turn-off timing, the gate control circuit is configured to execute a second control procedure when the current flowing in the wiring is smaller than the threshold, the second control procedure being executed so as to turn on a first target IGBT at the turn-on timing, to turn off the first target IGBT at the turn-off timing, and to turn off a second target IGBT prior to the turn-off timing, the first target IGBT being one of the first IGBT and the second IGBT, the second target IGBT being the other of the first IGBT and the second IGBT, the gate control circuit is configured to apply the control signal to the output terminal while the first switch and the second switch are turned on when switching both of the first IGBT and the second IGBT, and the gate control circuit is configured to apply the control signal to the output terminal while one of the first and second switches for controlling the first target IGBT is turned on and the other of the first and second switches for controlling the second target IGBT is turned off when switching the first target IGBT without switching the second target IGBT.

4. The switching circuit according to claim 3, wherein the first switching element and the second switching element are npn bipolar transistors.

\* \* \* \* \*